(12) United States Patent
Liu et al.

(10) Patent No.: US 11,729,969 B1
(45) Date of Patent: Aug. 15, 2023

(54) SEMICONDUCTOR DEVICE AND METHOD OF OPERATING THE SAME

(71) Applicant: TAIWAN SEMICONDUCTOR MANUFACTURING COMPANY LTD., Hsinchu (TW)

(72) Inventors: Hsiang-Wei Liu, Tainan (TW); Wei-Chen Chu, Taichung (TW); Chia-Tien Wu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/672,053

(22) Filed: Feb. 15, 2022

(51) Int. Cl.
*G11C 17/16* (2006.01)
*H10B 20/20* (2023.01)
*H01L 23/525* (2006.01)
*G11C 17/18* (2006.01)

(52) U.S. Cl.
CPC .............. *H10B 20/20* (2023.02); *G11C 17/16* (2013.01); *G11C 17/18* (2013.01); *H01L 23/5256* (2013.01)

(58) Field of Classification Search
CPC ................................ G11C 17/16; H10B 20/20
USPC ......................................................... 365/225.7
See application file for complete search history.

(56) References Cited

U.S. PATENT DOCUMENTS

| 9,196,377 B1* | 11/2015 | Park ........................ G11C 17/18 |
| 2002/0057593 A1* | 5/2002 | Hidaka .................... G11C 5/025 365/171 |
| 2022/0037341 A1* | 2/2022 | Liaw ................... H01L 23/5226 |
| 2022/0181337 A1* | 6/2022 | Huang ................ H01L 23/5252 |

* cited by examiner

*Primary Examiner* — Muna A Techane
(74) *Attorney, Agent, or Firm* — WPAT Law; Anthony King

(57) ABSTRACT

A semiconductor device and a method of operating the same are provided. The semiconductor device includes a transistor and a fuse structure electrically connected to the transistor. The fuse structure includes a first fuse element, a second fuse element, and a fuse medium. The second fuse element at least partially overlaps the first fuse element. The fuse medium connects the first fuse element and the second fuse element. The fuse medium includes an electrically conductive material.

20 Claims, 24 Drawing Sheets

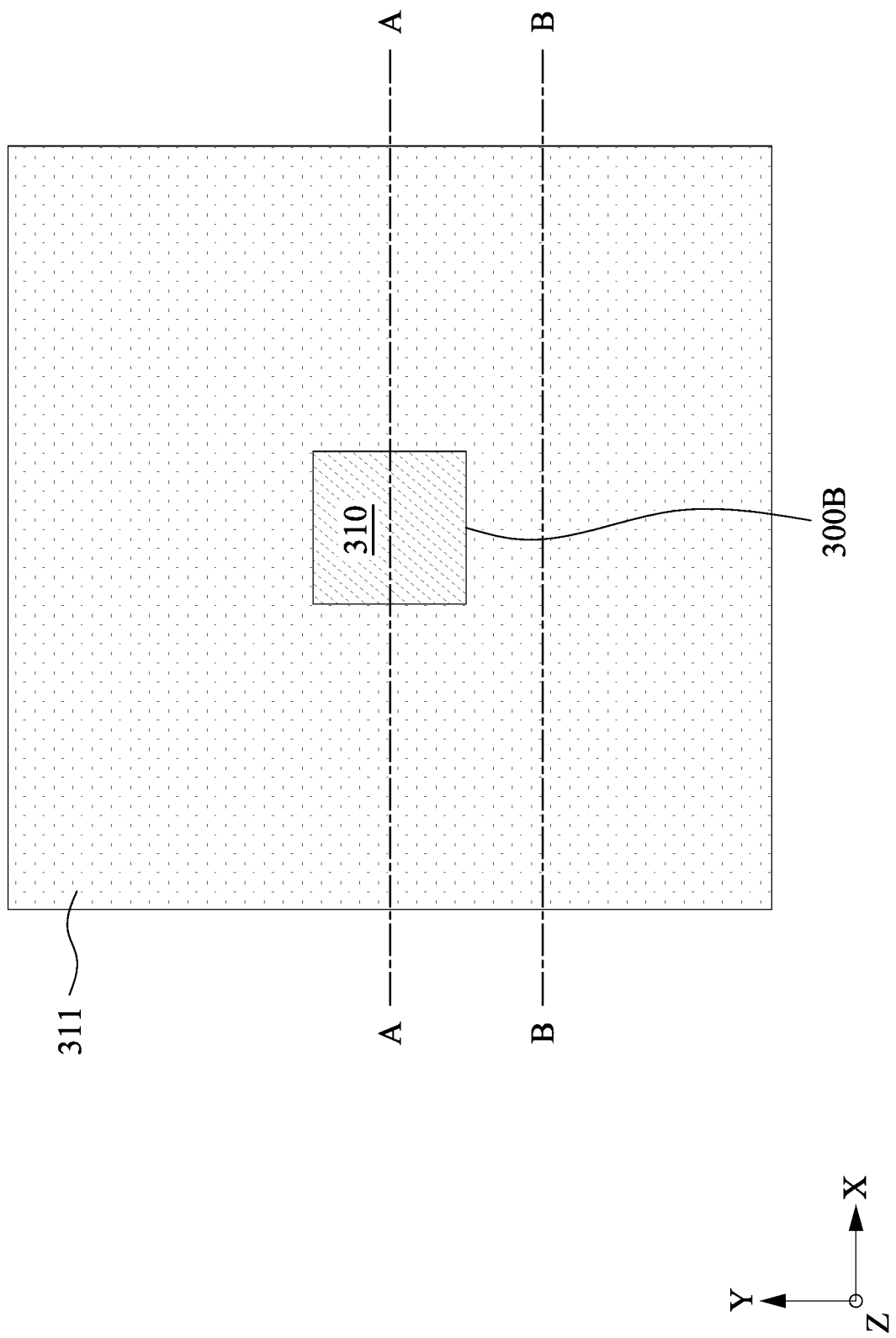

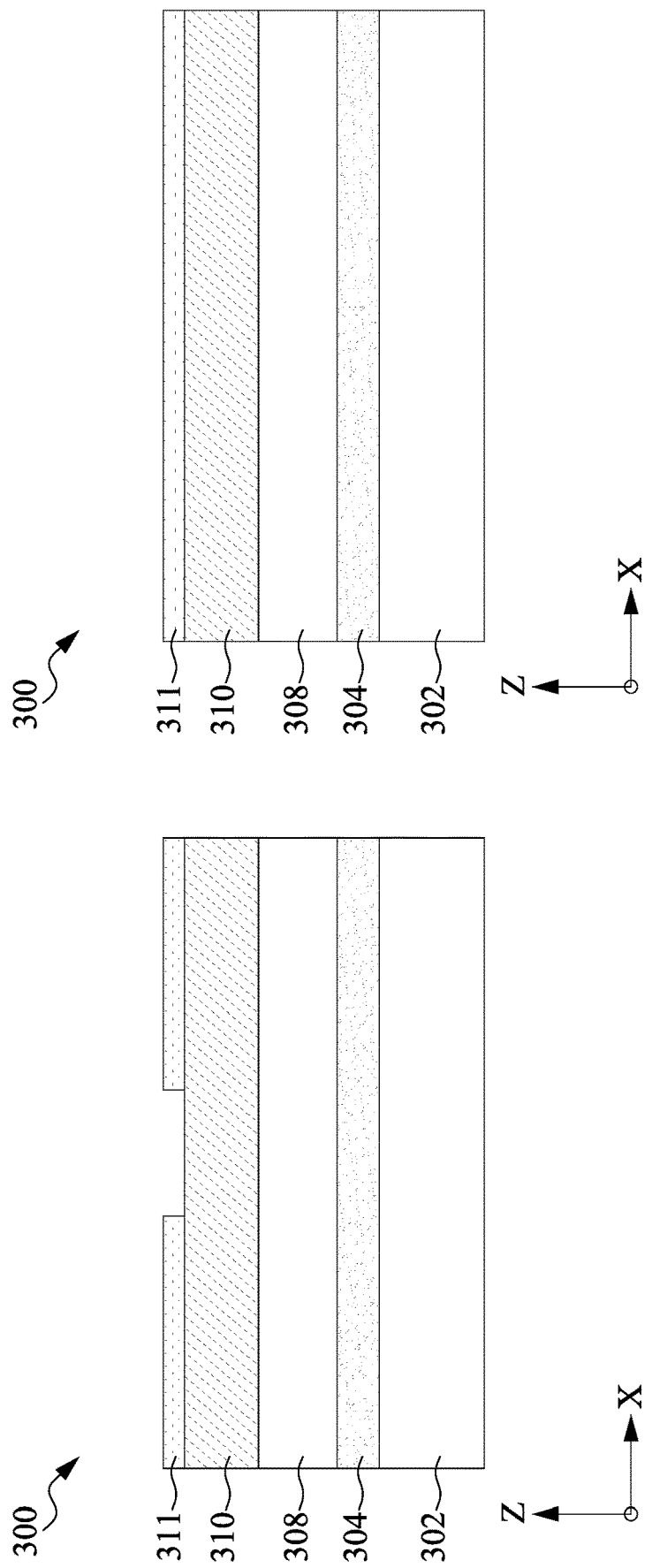

SEMICONDUCTOR DEVICE AND METHOD OF OPERATING THE SAME

BACKGROUND

Integrated circuits (ICs) normally constitute millions of interconnected devices, such as transistors, resistors, capacitors, and diodes, on a single semiconductor substrate chip. It is generally desired for ICs to operate as fast as possible while consuming the least amount of power. Semiconductor ICs can often include one or more types of memory, such as complementary Metal-Oxide-Semiconductor (CMOS) memory, antifuse memory, and E-fuse memory.

One-Time-Programmable (OTP) memory elements are used in ICs to provide Non-Volatile Memory (NVM). Data in NVM is not lost when the IC is turned off. NVM allows an IC manufacturer to store a lot number and security data on the IC, for example, and is useful in many other applications. One type of NVM utilizes an electrical fuse (eFuse).

Such eFuses are usually integrated into semiconductor ICs by a narrow strip of conducting material (e.g., metal, poly-silicon, etc.), commonly referred to as a "fuse link," between anode and cathode pads. Application of a programming current to the eFuse destroys (i.e., fuses) the link, thus changing the resistivity of the eFuse. This is referred to as "programming" the eFuse. The fuse state (i.e., whether it has been programmed) can be read using a sensing circuit

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 4, FIG. 5, FIG. 6, FIG. 7, FIG. 8, FIG. 9, FIG. 10, FIG. 11, and FIG. 12 illustrate various stages of manufacturing a semiconductor device, in accordance with some embodiments of the present disclosure.

FIG. 4A, FIG. 5A, FIG. 6A, FIG. 7A, FIG. 8A, FIG. 9A, FIG. 10A, FIG. 11A, and FIG. 12A illustrate various stages of manufacturing a semiconductor device along line A-A of FIG. 4, FIG. 5, FIG. 6, FIG. 7, FIG. 8, FIG. 9, FIG. 10, FIG. 11, and FIG. 12, respectively.

FIG. 4B, FIG. 5B, FIG. 6B, FIG. 7B, FIG. 8B FIG. 9B, FIG. 10B, FIG. 11B, and FIG. 12B illustrate various stages of manufacturing a semiconductor device along line B-B of FIG. 4, FIG. 5, FIG. 6, FIG. 7, FIG. 8, FIG. 9, FIG. 10, FIG. 11, and FIG. 12, respectively.

DETAILED DESCRIPTION

Figure 1:
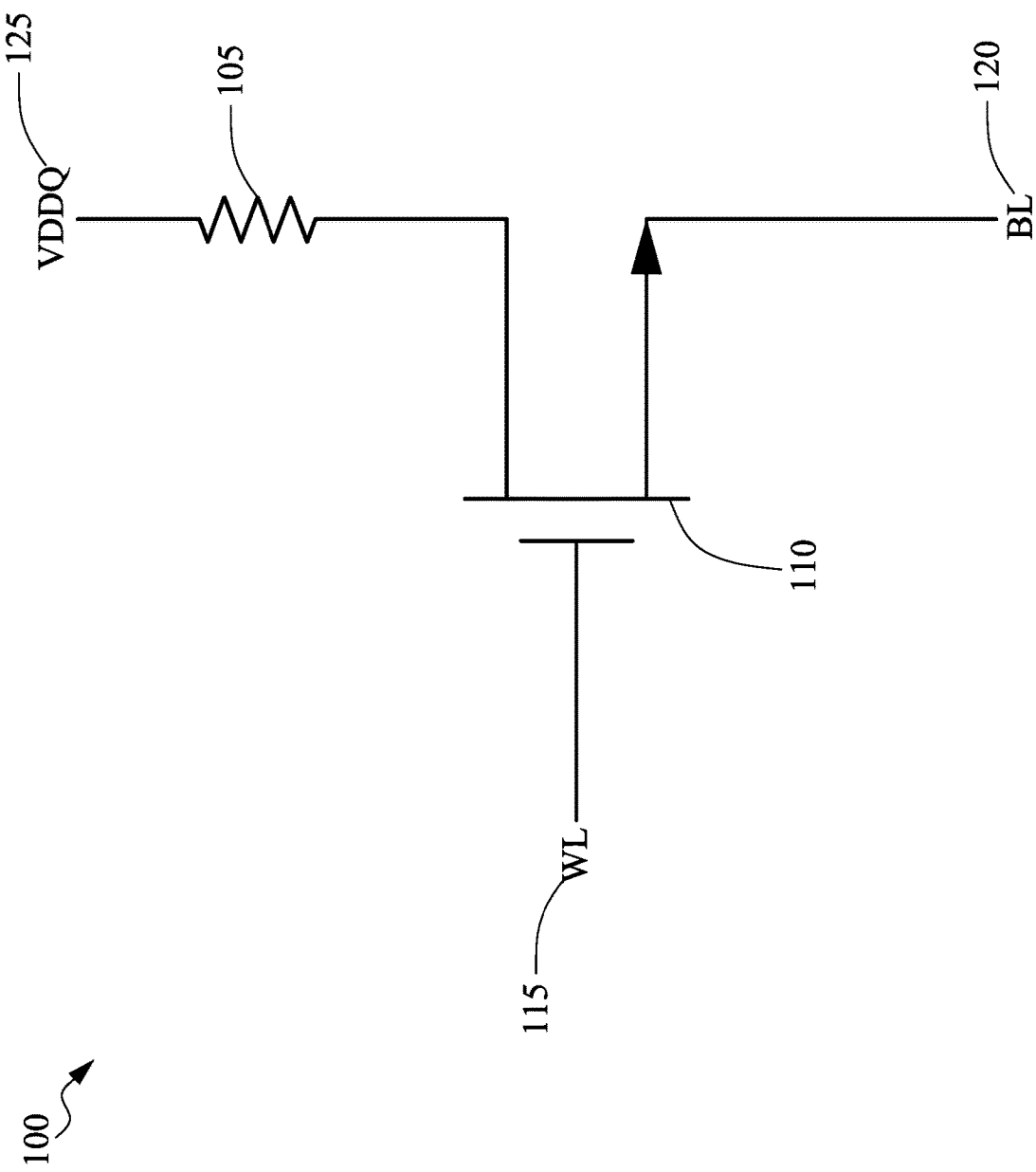
FIG. 1 is a block diagram of a memory cell of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Systems and methods as described herein provide a non-volatile memory, such as a non-volatile memory, having a delta metal fuse (i.e., a dfuse) non-volatile memory, such as a Read-Only Memory (ROM), may include a plurality of memory cells, each of which may include, a transistor connected to a word line and a dfuse connected to a bit line. When programming a "1", the dfuse may be blown by applying write voltages to the word and bit lines (e.g., to breakdown a dielectric comprising, for example, oxide between elements of the dfuse thus blowing the dfuse).

A ROM may include a substrate, a first conductive (e.g., metal) layer (M0) above the substrate a second conductive (e.g., metal) layer (M1) above M0, and a third conductive (e.g., metal) layer (M2) above M1. Other metal layers (e.g., M3, M4, . . . , and M12) so be included. The dfuses of the memory cell may be disposed in M0 or M2. The transistors of the memory cell may be disposed in the same semiconductor layer under M0.

Embodiments of the disclosure may include metal fuse elements of the dfuse that may be in the same metal layer, arranged in parallel with an overlap and offset as described in greater detail below. Further, a fuse medium may be used to connect the fuse elements. In some embodiments, the fuse medium may include or be made of conductive material(s) a reduced width, rendering a voltage for fuse structure to be broke down with a reduced operation voltage.

FIG. 1 is a block diagram that may illustrate a memory cell 100 semi conductor device in accordance with some embodiments.

As shown in FIG. 1, a memory cell 100, such as a non-volatile memory cell, can include a fuse structure 105 (e.g., dfuse), transistor 110, a Word Line (WL) 115 and a Bit Line (BL) 120. Within the memory cell 100 one terminal of the fuse structure 105 may be connected to the transistor 110, and the other terminal of the fuse structure 105 may be connected to VDDQ.

The transistor 110 may include metal-oxide-semiconductor field-effect transistor (MOSFET). As a MOSFET, consistent with embodiments of the disclosure, the transistor may, for example, utilize an N-type metal-oxide-semiconductor (NMOS) or a P-type metal-oxide-semiconductor (PMOS). The transistor 110 may be disposed under a metal zero (M0) layer of an integrated circuit that can include the memory cell 100.

Figure 2A:
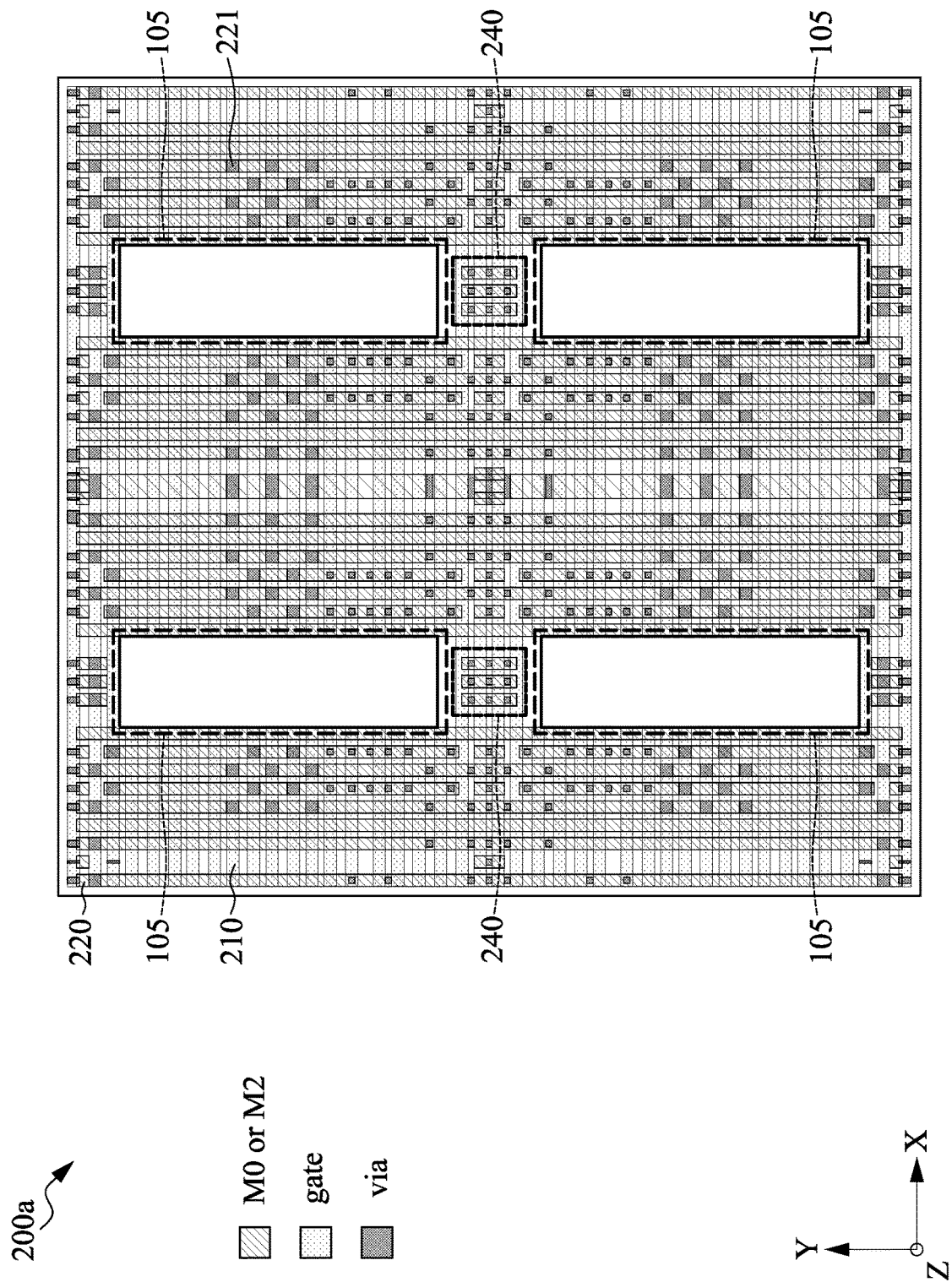
FIG. 2A is a top view of a layout of a semiconductor device, in accordance with some embodiments of the present disclosure.

FIG. 2A is a top view of a layout 200a of a semiconductor device, in accordance with some embodiments of the present disclosure.

In some embodiments, the layout 200a may include a plurality of gates 210, a plurality of conductive layers 220, a plurality of vias 221, and a plurality of fuse structures 105. It should be noted that some elements or features are omitted from FIG. 2A for brevity. The layout 200a can include additional elements not shown in FIG. 2A.

In some embodiments, each of the gates 210 can extend along an X-axis. The gates 210 can be arranged along a Y-axis. In some embodiments, the gate 210, included in a transistor may be disposed under the M0 layer of an integrated circuit. In some embodiments, the gate 210 can include a gate dielectric layer (not shown) and a gate electrode layer (not shown). The gate dielectric layer may be a single layer or multiple layers. In some embodiments, the gate dielectric layer may include silicon oxide ($SiO_x$), silicon nitride ($Si_xN_y$), silicon oxynitride (SiON), or a combination thereof. In some embodiments, the gate dielectric layer may include dielectric material, such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

The gate electrode layer can be disposed on the gate dielectric layer. The gate electrode layer is made of conductive material, such as aluminum (Al), copper (Cu), tungsten (W), titanium (Ti), tantalum (Ta), or other applicable materials. In some embodiments, the gate electrode layer includes a work function layer. The work function layer is made of metal material, and the metal material may include N-work-function metal or P-work-function metal.

In some embodiments, each of the conductive layers 220 can extend along a Y-axis. The conductive layers 220 can be arranged along an X-axis. In some embodiments, the conductive layer 220 can include metal, such as tungsten (W), copper (Cu), Ru, Ir. Ni, Os, Rh, Al, Mo, Co, alloys thereof, combinations thereof or any metallic material with suitable resistance and gap-fill capability. In some embodiments, the conductive layers 220 can be a part of M0 layer or constitute M0 layer, which is configured to electrically connect the gate 210 to upper metallization layers, such as M1 layer, M2 layer, and so on. As used herein, "M0 layer" may refer to the lowest metallization layer of a semiconductor device electrically (and/or physically) connected to a conductive contact that may be formed on the gate or on source/drain feature.

In some embodiments, the conductive layers 220 can be M2 layer or constitute M2 layer, which is at a horizontal level above M0 layer, and M1 layer is at a horizontal level between M0 layer and M2 layer.

The via 221 can be utilized to electrically connect to different metal layers. For example, the via 221 can connect M1 layer and M2 layer.

In some embodiments, the fuse structure 105 can be located at a horizontal level the same as that of the conductive layer 220. That is, the fuse structure 105 can be a part of M0 layer or a part of M2 layer. In some embodiments, the plurality of fuse structures 105 can be spaced apart from each other by, for example, a guard ring structure 240.

The guard ring 240 can be utilized to, for example, electrically isolate the plurality of fuse structures 105. In some embodiments, the guard ring 240 can at least partially surround the fuse structure 105. In some embodiments, a portion of the guard ring 240 can be included in the M0 layer or M2 layer. In some embodiments, the guard ring 240 can include a plurality of conductive layers located at different horizontal levels. The present disclosure is not intended to limit the structure and layout of the guard ring 240.

Figure 2B:
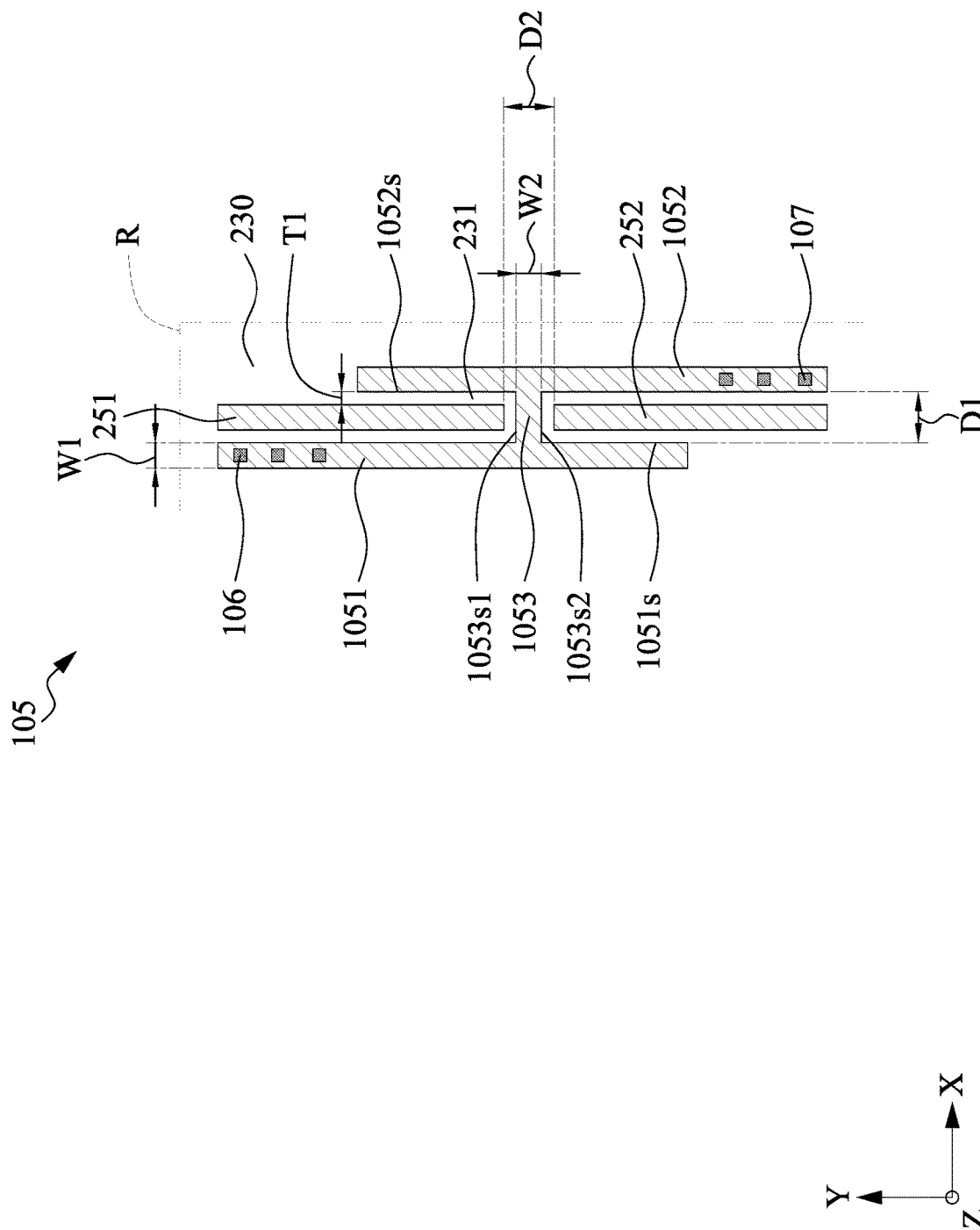
FIG. 2B illustrates the fuse structure of FIG. 2A, in accordance with some embodiments of the present disclosure.

FIG. 2B illustrates the fuse structure 105 of FIG. 2A, in accordance with some embodiments of the present disclosure.

In some embodiments, the fuse structure 105 includes a fuse element 1051, a fuse element 1052, and a fuse medium 1053. In some embodiments, the fuse element 1051, fuse element 1052, and fuse medium 1053 can be located at a horizontal level the same as that of the conductive layer 220. That is, the fuse element 1051, the fuse element 1052, and fuse medium 1053 can be a part of M0 layer or a part of M2 layer. The fuse element 1051 can extend along a Y-axis. The fuse element 1051 can extend parallel to the conductive layer 220. In some embodiments, the fuse element 1051 can extend perpendicular to the conductive layer 220. In some embodiments, the fuse element 1051 can include electrically conductive materials, such as W, Cu, Ru, Ir, Ni, Os, Rh, Al, Mo, Co, or alloys thereof. In some embodiments, the fuse element 1051 can be configured to electrically connect a transistor (such as the transistor 110 shown in FIG. 1) through conductive vias 106 and other features (not shown). The fuse element 1051 can have a width W1 along an X-axis. In some embodiments, the width W1 can range from about 10 nm to about 40 nm, such as 10 nm, 15 nm, 20 nm, 25 nm, 30 nm, 35 nm, or 40 nm.

The fuse element 1052 can extend along a Y-axis. In some embodiments, the fuse element 1052 can at least partially overlap the fuse element 1051 along an X-axis. In some embodiments, the fuse element 1052 can include electrically conductive materials, such as W, Cu, Ru, Ir, Ni, Os, Rh, Al, Mo, Co, or alloys thereof. In some embodiments, the fuse element 1052 can be configured to electrically connect VDDQ through conductive vias 107 and other features (not shown). The fuse element 1051 can be spaced apart from the fuse element 1052 by a distance D1 along an X-axis. In some embodiments, the width D1 can range from about 10 nm to about 80 nm, such as 10 nm, 20 nm, 30 nm, 40 nm, 50 nm, 60 nm, 70 nm, or 80 nm.

The fuse medium 1053 can extend along an X-axis. In some embodiments, the fuse medium 1053 can be disposed between the fuse elements 1051 and 1052. In some embodiments, the fuse medium 1053 can connect the fuse elements 1051 and 1052. In some embodiments, the fuse medium 1053 can directly contact a side 1051s1 of the fuse element 1051. In some embodiments, the fuse medium 1053 can directly contact a side 1052s1 of the fuse element 1052 that faces the side 1051s1 of the fuse element 1051. The fuse medium 1053 can extend from the side 1051s1 of the fuse element 1051 to the side 1052s1 of the fuse element 1052.

In some embodiments, the fuse medium 1053 can include or be made of electrically conductive material. In some embodiments, the material of the fuse medium 1053 is the same as that of the fuse element 1051. In some embodiments, no interface is formed between the fuse element 1051 and the fuse medium 1053. In some embodiments, no interface can be observed between the fuse element 1051 and the fuse medium 1053 by scanning electron microscope (SEM) or other imaging devices. In some embodiments, the fuse medium 1053 has a width W2 along a Y-axis. In some embodiments, the width W2 can be substantially the same as the width W1. In some embodiments, the width W2 can be different from the width W1. In some embodiments, the width W2 of the fuse medium 1053 can range from about 3 nm to about 40 nm, such as 3 nm, 5nm, 10nm, 15nm, 20nm, 25 nm, 30 nm, 35 nm, 40 nm, 45 nm, or 50 nm.

In some embodiments, the fuse medium 1053 is adapted to change from a first conductive state to a second conductive state after a current exceeding a threshold level flows through the fuse medium 1053. For example, the resistance of the fuse medium 1053 can be changed after a current exceeding a threshold level flows through the fuse medium 1053. Thus, the resistance of the fuse structure 105 can be changed after a current exceeding a threshold level flows through the fuse structure 105. In some embodiments, the fuse medium 1053 has a breakdown after a current exceeding the threshold level flows through the fuse medium 1053.

The semiconductor device can include a dielectric layer 230. The dielectric layer 230 may include oxide ($SiO_x$), silicon nitride ($Si_xN_y$), silicon oxynitride (SiON), or other suitable materials. The dielectric layer 230 can be utilized to separate the conductive layers 220.

In some embodiments, the dielectric layer 230 can include a spacer 231 disposed on the side 1051s1 of the fuse element 1051. The spacer 231 can be disposed on the side 1052s1 of the fuse element 1052. The spacer 231 can be disposed on a side 1053s1 of the fuse medium 1053. The spacer 231 can be disposed on a side 1053s2, opposite to the side 1053s1, of the fuse medium 1053. In some embodiments, the fuse element 1051 can be spaced apart from the fuse element 1052 by the dielectric layer 230. In some embodiments, the sides 1053s1 and 1053s2 of the fuse medium 1053 are covered by the spacer 231. The spacer 231 of the dielectric layer 230 can have a thickness T1, which can be a distance defined by the fuse element 1051 and a metallization layer (e.g., 251). In some embodiments, the thickness T1 can range from about 3 nm to about 20 nm, such as 3 nm, 5 nm, 8 nm, 10 nm, 13 nm, 15 nm, 18 nm, or 20 nm.

The layout 200a of the semiconductor device can include a metallization layer 251 and a metallization layer 252. In some embodiments, the metallization layers 251 and 252 can be located on a horizontal level the same as that of the conductive layer 220. That is, the metallization layers 251 and 252 can be a part of M0 layer or a part of M2 layer. Each of the metallization layers 251 and 252 can extend along a Y-axis. The metallization layer 251 can be located between the fuse elements 1051 and 1052. The metallization layer 251 can face the side 1053s1 of the fuse medium 1053. The metallization layer 252 can be located between the fuse elements 1051 and 1052. The metallization layer 252 can face the side 1053s2 of the fuse medium 1053. In some embodiments, the metallization layer 251 can be spaced apart from the metallization layer 252 by the dielectric layer 230. In some embodiments, the metallization layer 251 can be spaced apart from the metallization layer 252 by the fuse medium 1053. In some embodiments, the metallization layer 251 can be spaced apart from the fuse medium 1053 by the spacer 231 of the dielectric layer 230. In some embodiments, the metallization layer 252 can be spaced apart from the fuse medium 1053 by the spacer 231 of the dielectric layer 230.

In some embodiments, the metallization layer 251 and/or 252 can be electrically isolated from the fuse structure 105. In some embodiments, the metallization layer 251 and/or 252 can be utilized as a dummy metallization layer. In some embodiments, the metallization layer 251 and/or 252 can be electrically floating. The metallization layers 251 and 252 can be spaced apart by a distance D2. In some embodiments, the distance D2 may be double the thickness T1 of the spacer 231. In some embodiments, the distance D2 can range from about 10 nm to about 50 nm, such as 5 nm, 10 nm, 15 nm, 20 nm, 25 nm, 30 nm, 35 nm, 40 nm, 45 nm, or 50 nm.

The fuse structure 105 may have a weak point at the bending portion defined by the fuse element 1051 (or 1052) and the fuse medium 1053, assisting in breakdown of the fuse structure 105. In this embodiment, the fuse medium 1053 can replace the conventional fuse medium, such as silicon oxide. In this embodiment, the width of the fuse medium 1053 can be controlled by determining the thickness of the spacer 231 of the dielectric layer 230. Thus, the fuse structure 105 can have flexible size based on requirements of fabrication of a semiconductor device. The operation voltage of breakdown of the fuse structure 105 can be reduced. The area of a memory cell can also be reduced and performance of the semiconductor device can be improved.

Figure 3:
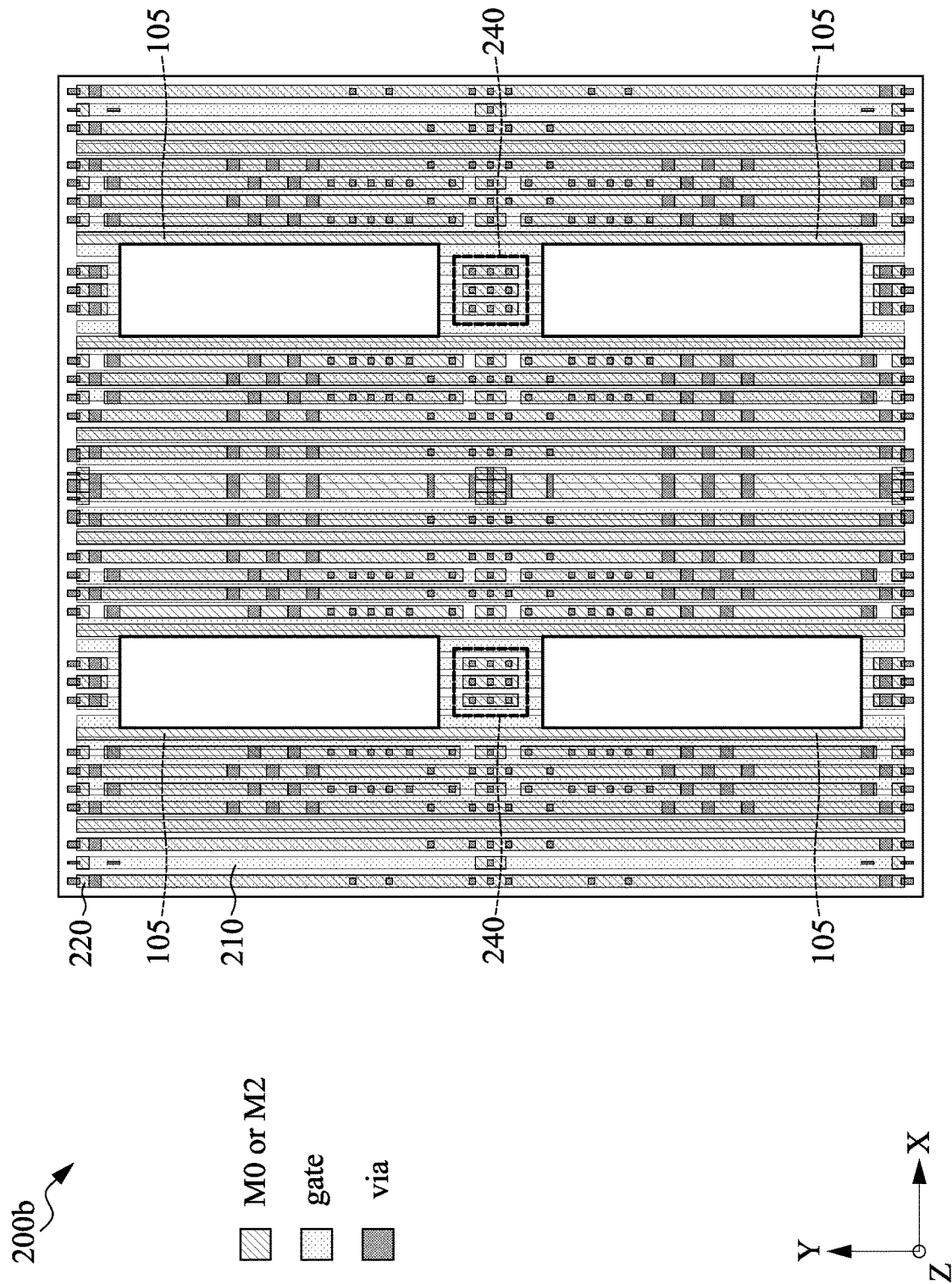
FIG. 3 is a top view of a layout of a semiconductor device, in accordance with some embodiments of the present disclosure.

FIG. 3 is a top view of a layout 200b of a semiconductor device, in accordance with some embodiments of the present disclosure, The layout 200b is similar to layout 200a, differing in that the gate 210 can extend along a direction substantially parallel to that of the conductive layer 220.

In some embodiments, the fuse element (e.g., fuse element 1051 or 1052) of a fuse structure (e.g., fuse structure 105) can extend along a direction substantially parallel to that of the gate 210.

FIG. 4, FIG. 5, FIG. 6, FIG. 7, FIG. 8, FIG. 9, FIG. 10, FIG. 11, and FIG. 12 illustrate various stages of manufacturing a semiconductor device, in accordance with some embodiments of the present disclosure. FIG. 4A, FIG. 5A, FIG. 6A, FIG. 7A, FIG. 8A, FIG. 9A, FIG. 10A, FIG. 11A, and FIG. 12A are cross-sections along line A-A, and FIG. 4B, FIG. 5B, FIG. 6B, FIG. 7B, FIG. 8B, FIG. 9B, FIG. 10B, FIG. 11B, and FIG. 12B are cross-sections along line B-B of FIG. 4, FIG. 5, FIG. 6, FIG. 7, FIG. 8, FIG. 9, FIG. 10, FIG. 11, and FIG. 12, respectively. More specifically, the aforesaid drawings illustrate a series of processes of forming a fuse structure 105 shown in FIG. 2B.

FIG. 4B, FIG. 5B, FIG. 6B, FIG. 7B, FIG. 8B, FIG. 9B, FIG. 10B, FIG. 11B, and FIG. 12B illustrate various stages of manufacturing a semiconductor device along line B-B of FIG. 4, FIG. 5, FIG. 6, FIG. 7, FIG. 8, FIG. 9, FIG. 10, FIG. 11, and FIG. 12, respectively.

Referring to FIGS. 4, 4A, and 4B, a semiconductor structure 300 is provided. The semiconductor structure 300 can include a substrate 302, a layer 304, a layer 308 and a layer 310. The substrate 302 can include a semiconductor carrier (not shown), such as a wafer, which can include a bulk semiconductor, a semiconductor-on-insulator (SOI) substrate, or the like. The substrate 302 can include multiple features, such as gates, source/drain features, conductive contacts, conductive vias, which are omitted for brevity.

The layer 304 can be disposed on the substrate 302. The layer 304 can include, for example, oxide ($SiO_x$), silicon nitride ($Si_xN_y$), silicon oxynitride (SiON), or other suitable materials. The layer 304 can serve to be patterned for subsequently forming a conductive pattern, including the fuse structure 105 and the metallization layers 251 and 252 shown in FIG. 2B.

The layer 308 can be disposed on the layer 304. The layer 308 can be utilized to define the conductive pattern. In some embodiments, the layer 308 can include multiple layers, such as oxide, metal nitride, or other suitable materials.

The layer 310 can be disposed on the layer 308. The layer 310 can be utilized to define the conductive pattern. The materials of the layers 308 and 310 can have different etching selectivity when etchant is applied. In some embodiments, the layer 310 can include, for example, polysilicon or other suitable materials.

As shown in FIGS. 4, 4A, and 4B, a photosensitive structure 311 is formed on the layer 310. The photosensitive structure 311 can include multiple photoresists and/or other suitable layers. The layer 310 corresponding to a region 300B can be exposed by the photosensitive structure 311. The region 300B is utilized to define a distance of dummy conductive layers (e.g., metallization layers 251 and 252). The region 300B can also be referred to as "Cut B."

Figure 5:
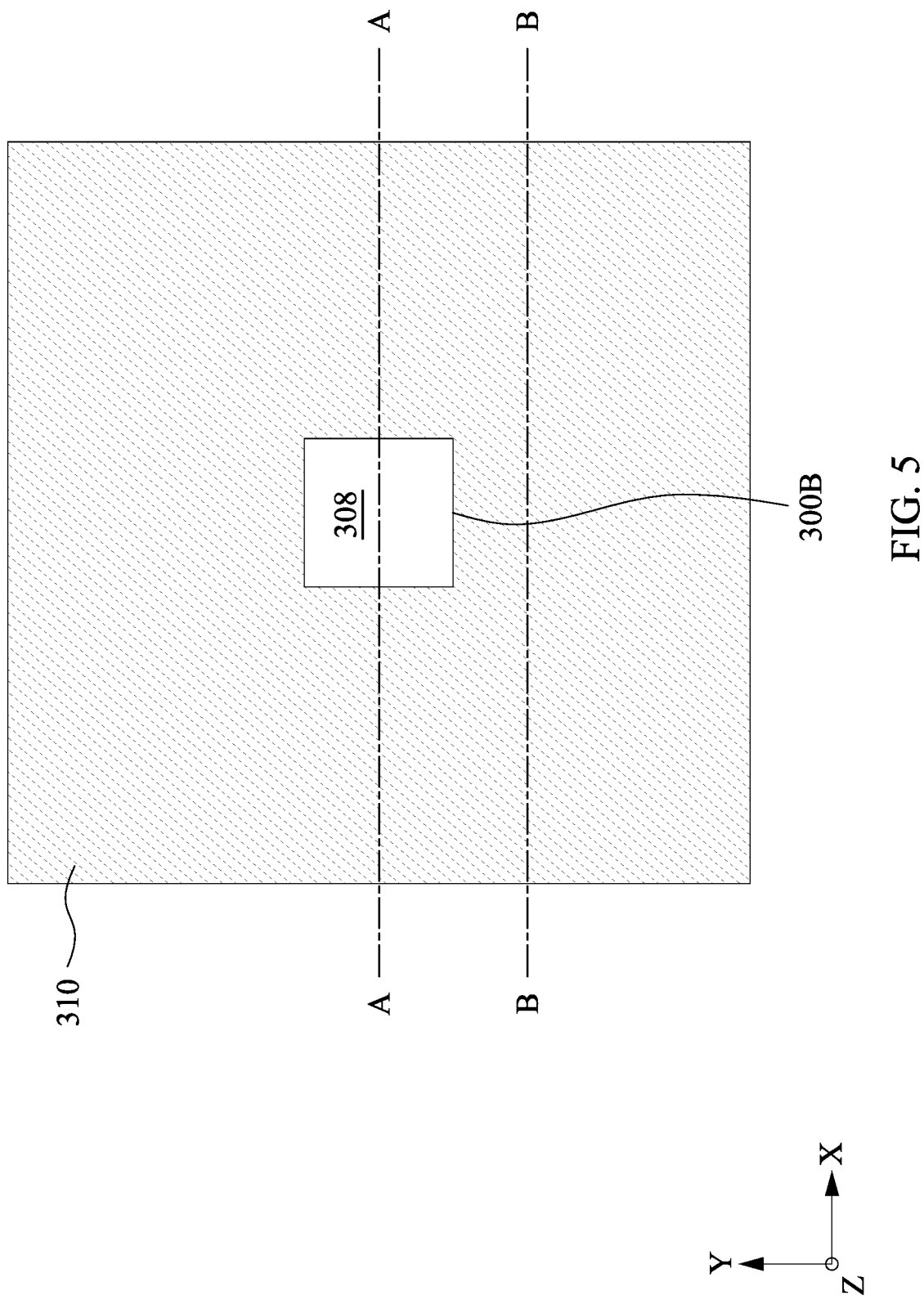
Figure 5B:
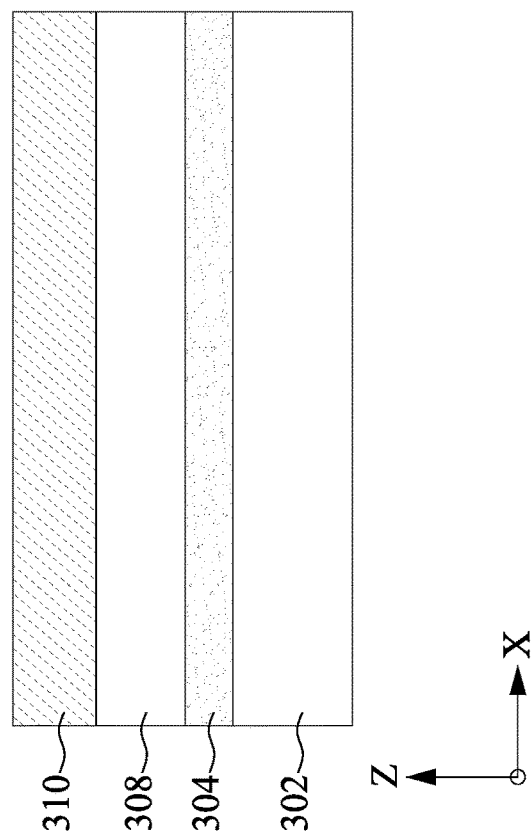
Figure 5A:
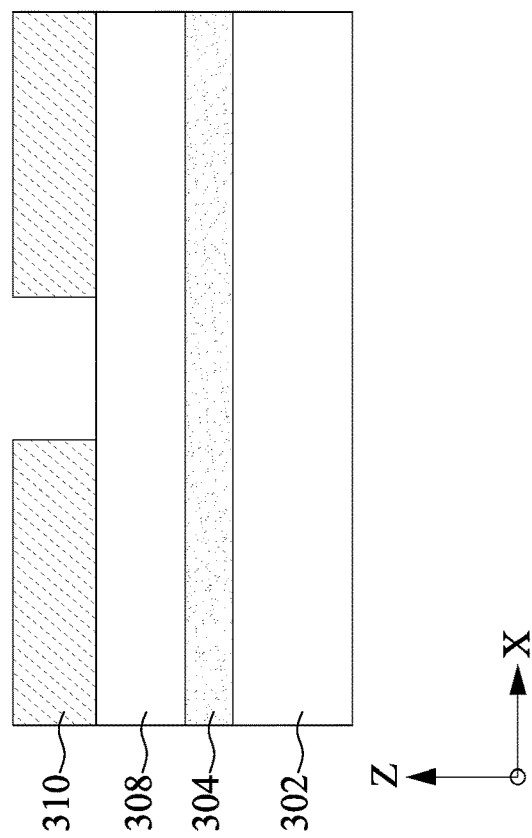

Referring to FIGS. 5, 5A, and 5B, an etching operation is performed to remove a portion of the layer 310 corresponding to the region 300B. The etching operation can include wet etching, dry etching or other suitable processes. The photosensitive structure 311 can be removed after the etching operation is performed. The layer 308 corresponding to the region 300B is exposed by the layer 310.

Figure 6:
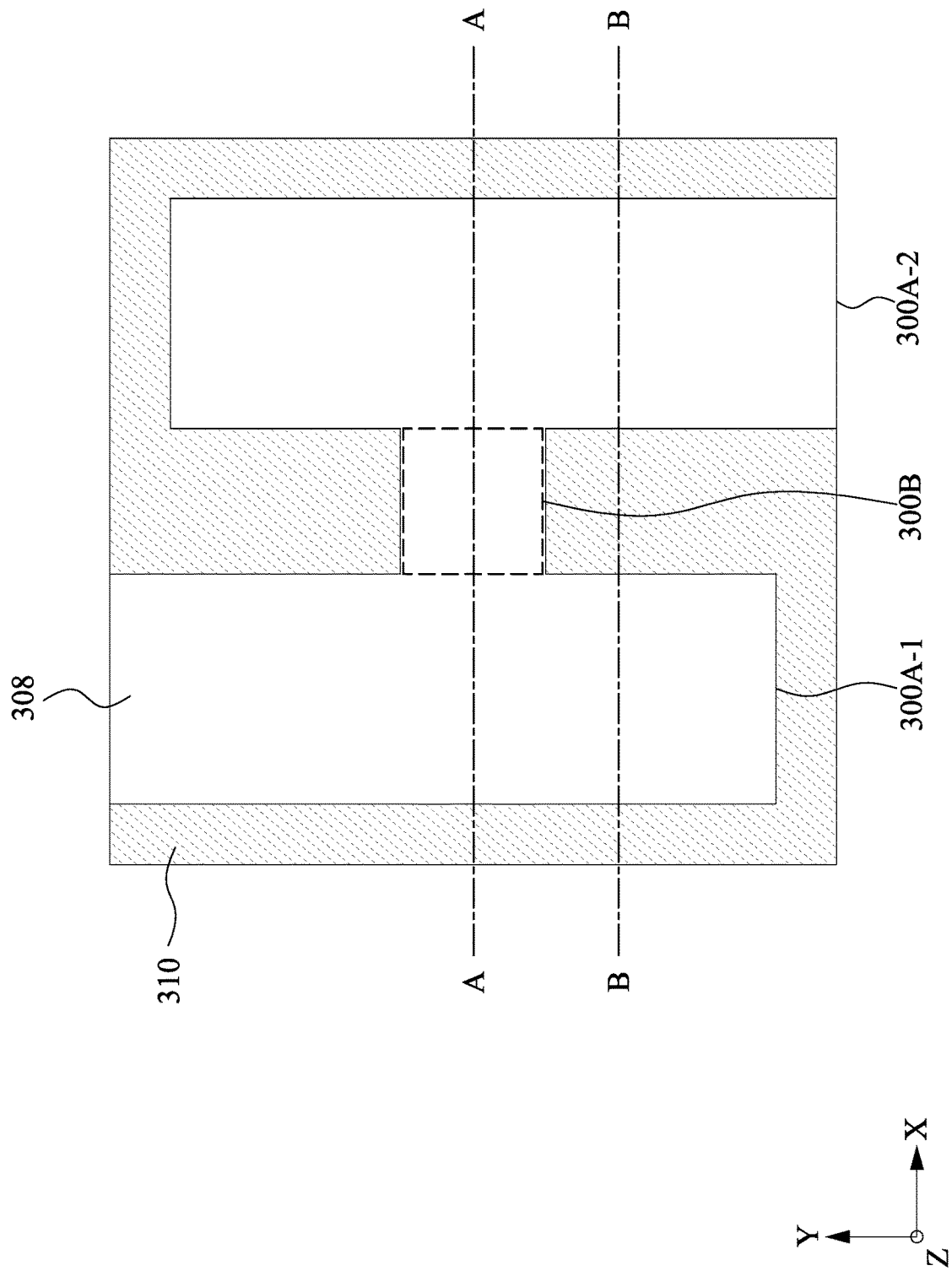
Figure 6B:
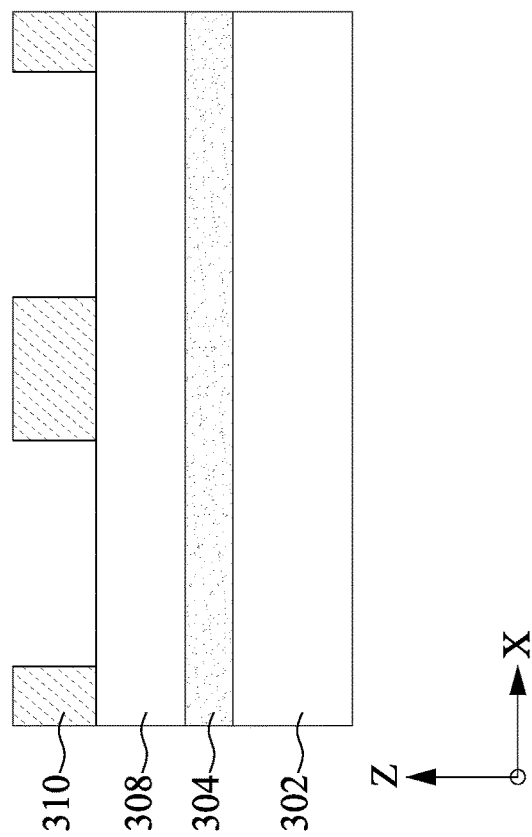
Figure 6A:
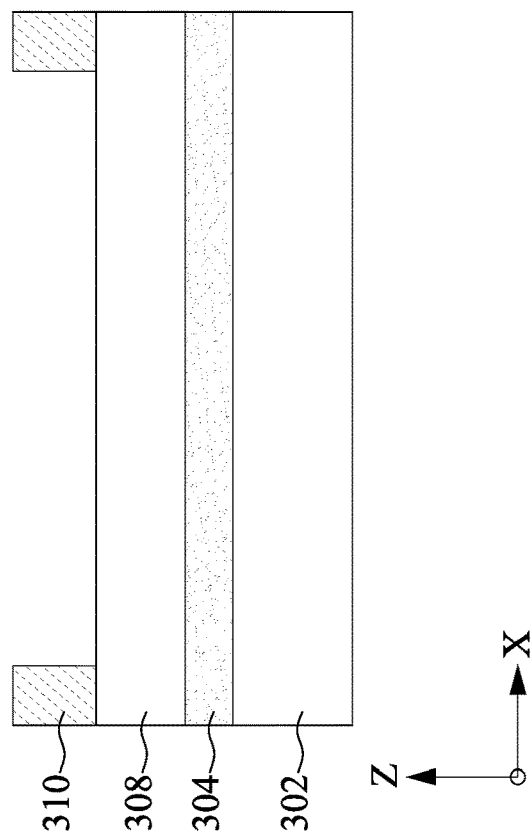

Referring to FIGS. 6, 6A, and 6B, a portion of the layer 310 can be removed. The portion of the layer 310 corresponding to the regions 300A-1 and 300A-2 are removed. The regions 300A-1 and 300A-2 can be utilized to define a profile of a dielectric layer subsequently formed. The regions 300A-1 and 300A-2 can be utilized to define the locations of the fuse elements (e.g., fuse elements 1051 and 1052 shown in FIG. 2B). The layer 308 corresponding to the regions 300A-1 and 300A-2 is exposed by the layer 310.

Figure 7:
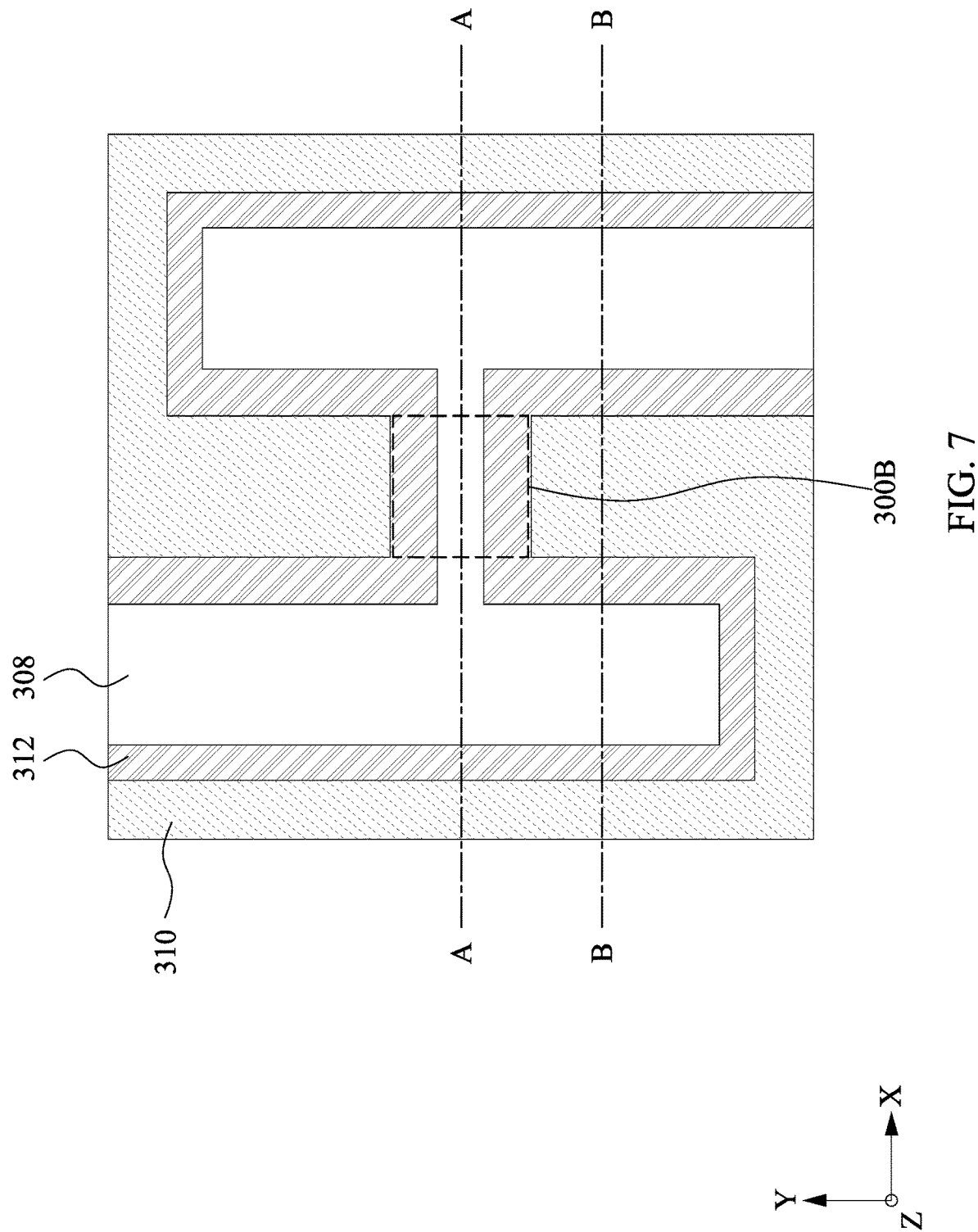
Figure 7B:
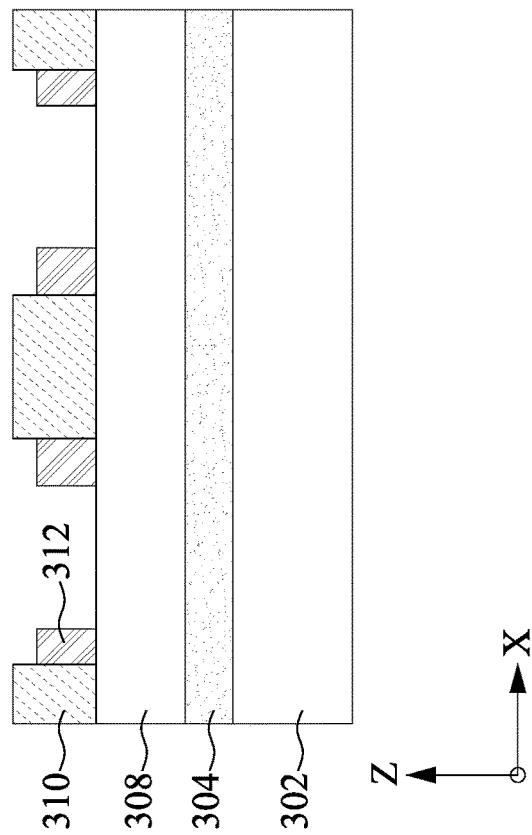
Figure 7A:
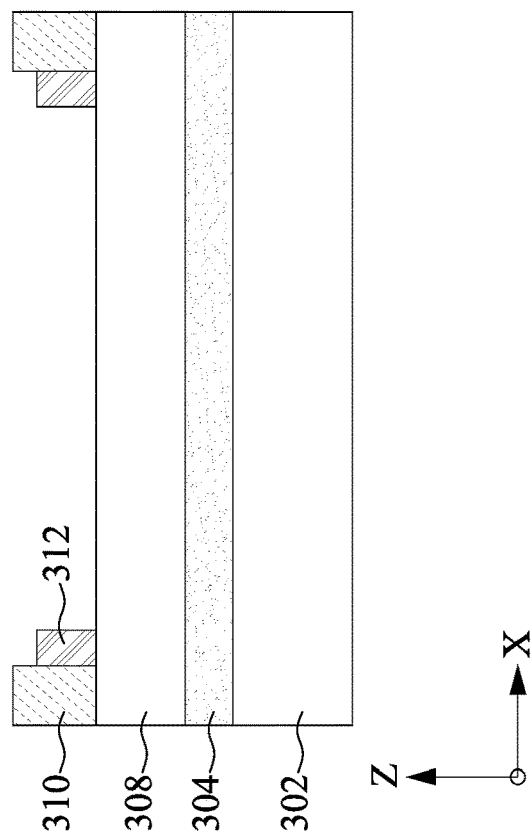

Referring to FIGS. 7, 7A, and 7B, a profile modifier 312 can be formed on the layer 308. The profile modifier 312 can be formed on the sidewall of the layer 310. The profile modifier 312 can be conformity formed on the sidewall of the layer 310. The profile modifier 312 can be utilized to define the pattern of the fuse structure (e.g., fuse structure 105 shown in FIG. 2B). In some embodiments, the thickness of the profile modifier 312 can he determined to ensure that the layer 308 corresponding to the region 300B can be at least partially exposed by the profile modifier 312. In some embodiments, the thickness of the profile modifier 312 can be utilized to determine a width of a fraise medium (e.g., fuse medium 1053 shown in FIG. 2B). The profile modifier 312 can include dielectric materials, such as silicon oxide. The profile modifier 312 can be formed by deposition operation, such as an atomic layer deposition (ALD), a chemical vapor deposition (CVD), a physical vapor deposition (PVD), or other suitable processes.

Figure 8:
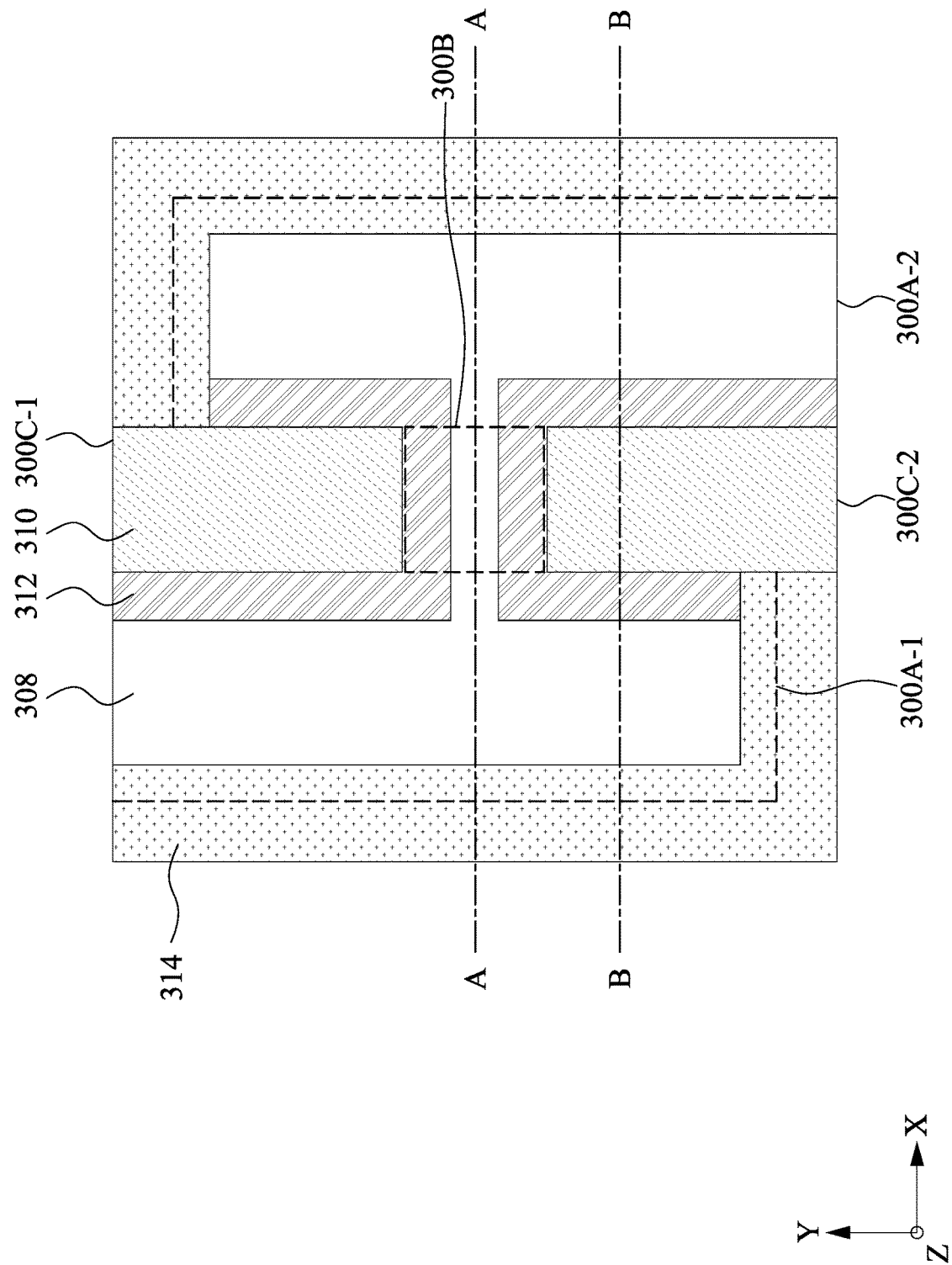
Figure 8B:
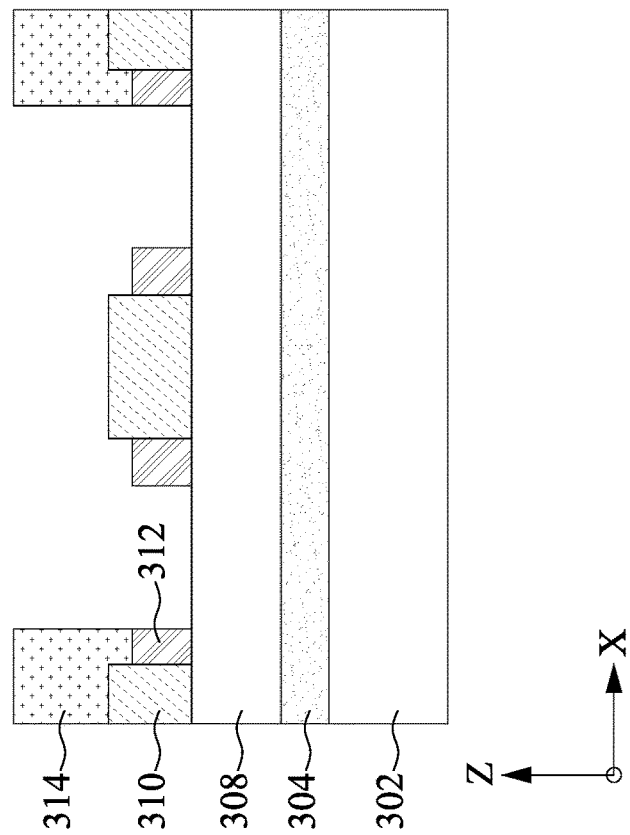
Figure 8A:
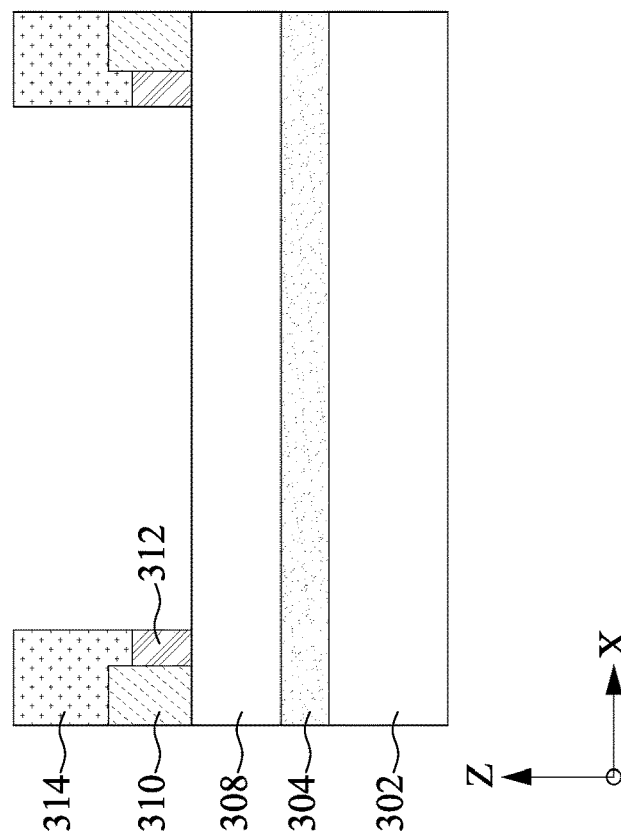

Referring to FIGS. 8, 8A, and 8B, a photosensitive structure 314 can be formed to cover a portion of the layer 310 and profile modifier 312. The portion of the photosensitive structure 314 can be utilized to define the pattern of the dummy conductive layers. In some embodiments, the layer 308 and profile modifier 312 corresponding to the region 300B are exposed by the photosensitive structure 314. In some embodiments, at least a portion of the layer 308 and profile modifier 312 corresponding to the regions 300A-1 and 300A-2 are exposed by the photosensitive structure 314. In some embodiments, regions 300C-1 and 300C-2 are exposed by the photosensitive structure 314. The regions 300C-1 and 300C-2 can be configured to define the pattern of dummy conductive layers (e.g., metallization layers 251 and 252).

Figure 9:
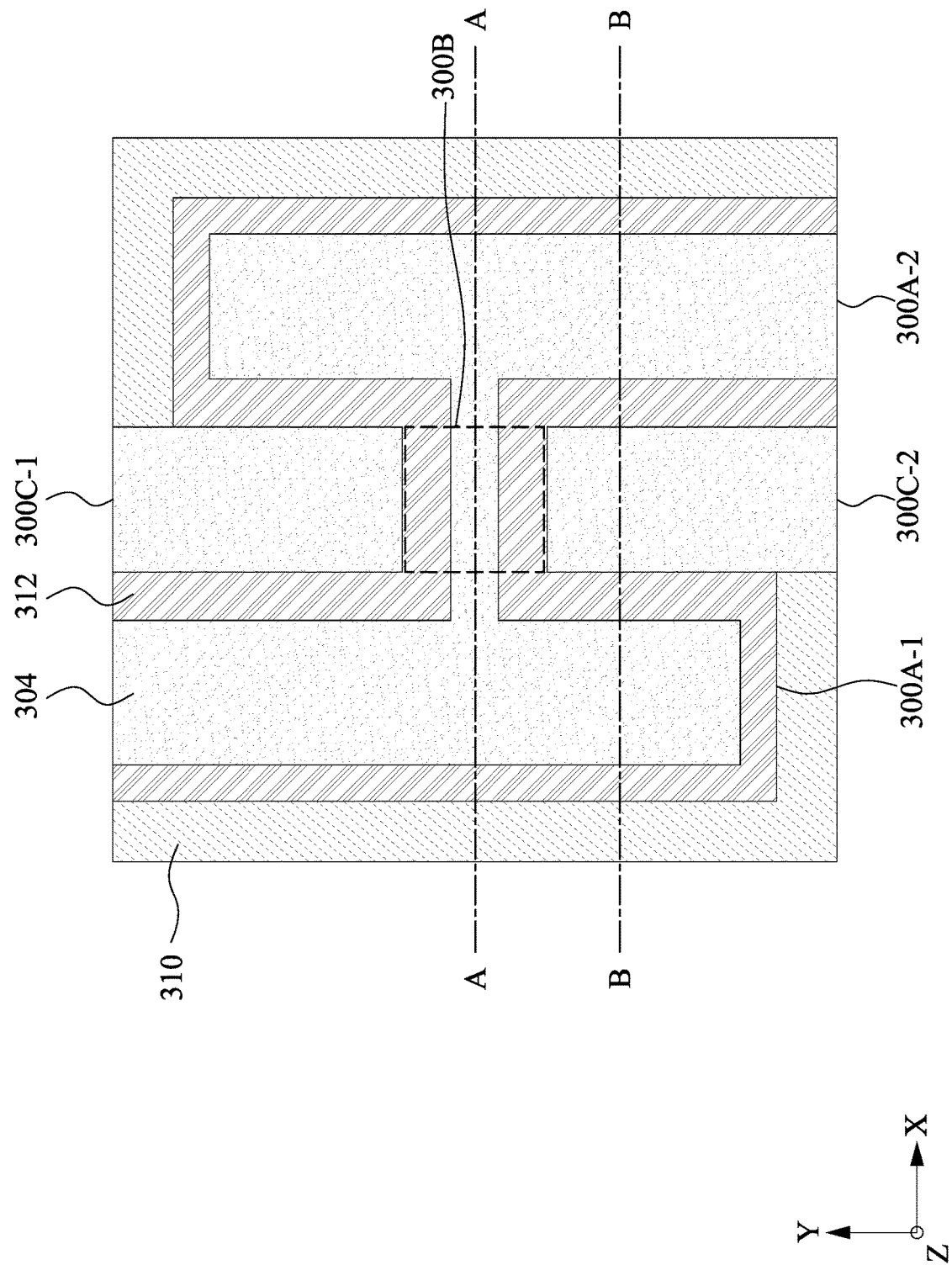
Figure 9B:
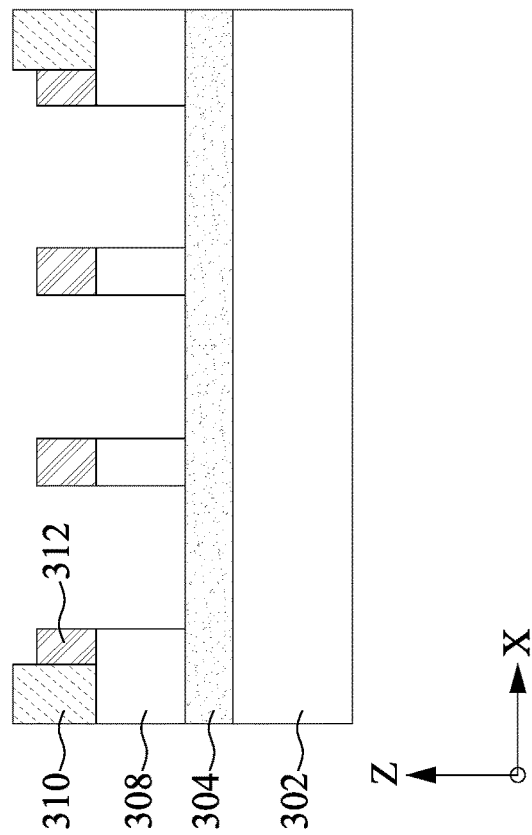
Figure 9A:
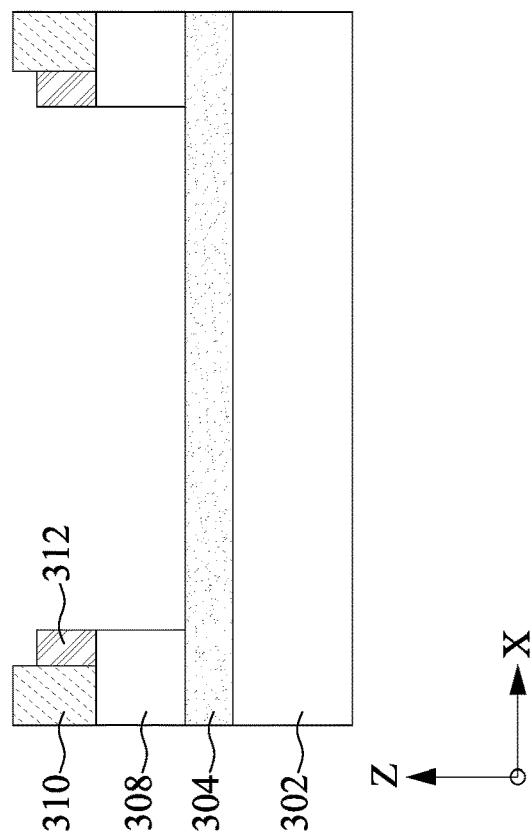

Referring to FIGS. 9, 9A, and 9B, etching is performed to remove the layer 308 and the layer 310 not covered by the photosensitive structure 314. The layers 308 and 310, not covered by the profile modifier 312, corresponding to regions 300C-1 and 300C-2, can be removed. The photosensitive structure 314 can be removed after the etching. The layer 304 can be exposed by the layer 310 and the profile modifier 312. In some embodiments, the layers 308 corresponding to regions 300A-1, 300A-2, 300B, 300C-1, and 300C-2, are removed. In some embodiments, the layers 304 corresponding to regions 300A-1, 300A-2, 300B, 300C-1, and 300C-2, are exposed.

Figure 10:
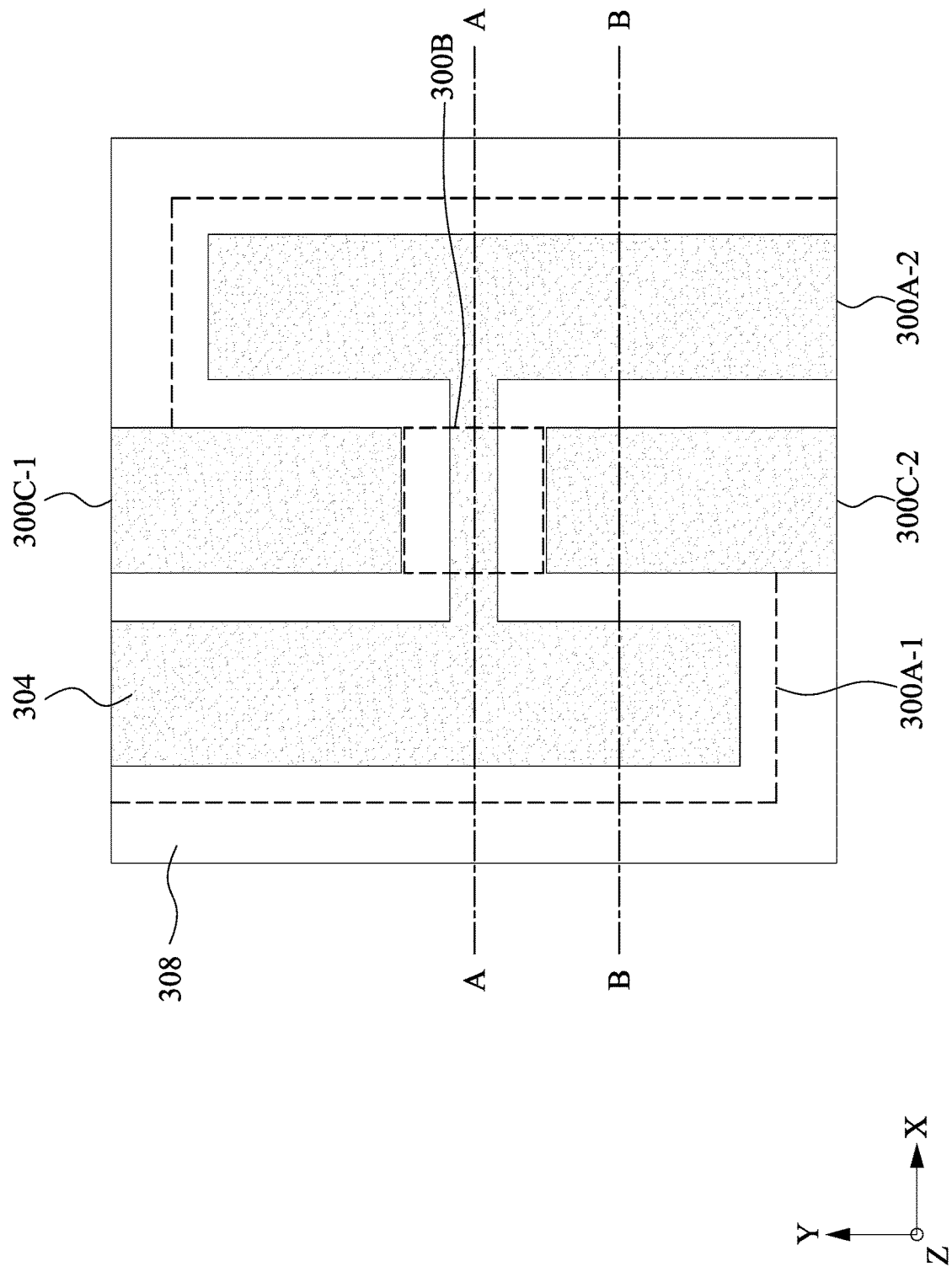
Figure 10B:
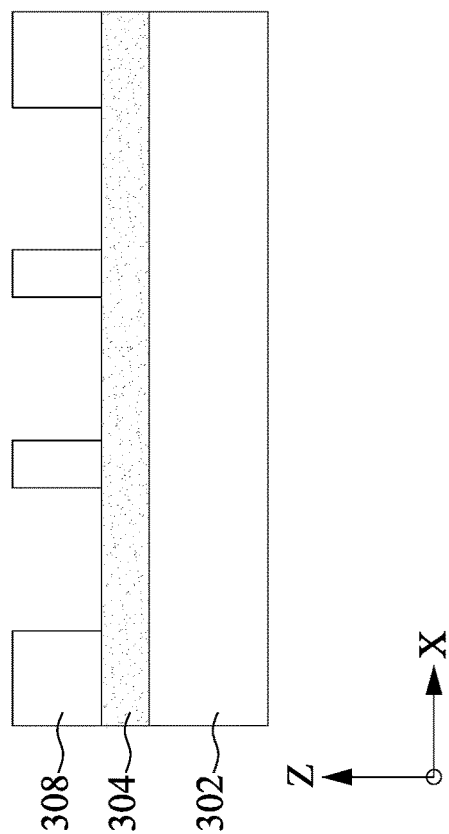
Figure 10A:
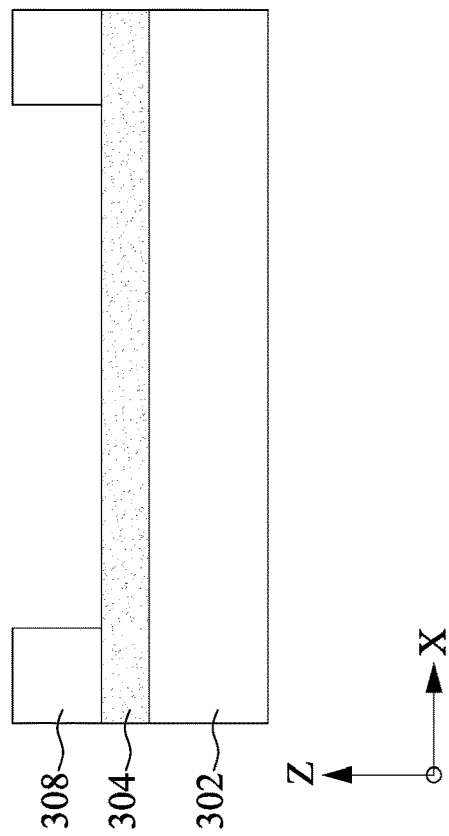

Referring to FIGS. 10, 10A, and 10B, the layer 310 and the profile modifier 312 can be removed to expose the layer 308. The layer 308 at least corresponding to the spacer (e.g., the spacer 231 shown in FIG. 2B) is exposed.

Figure 11:
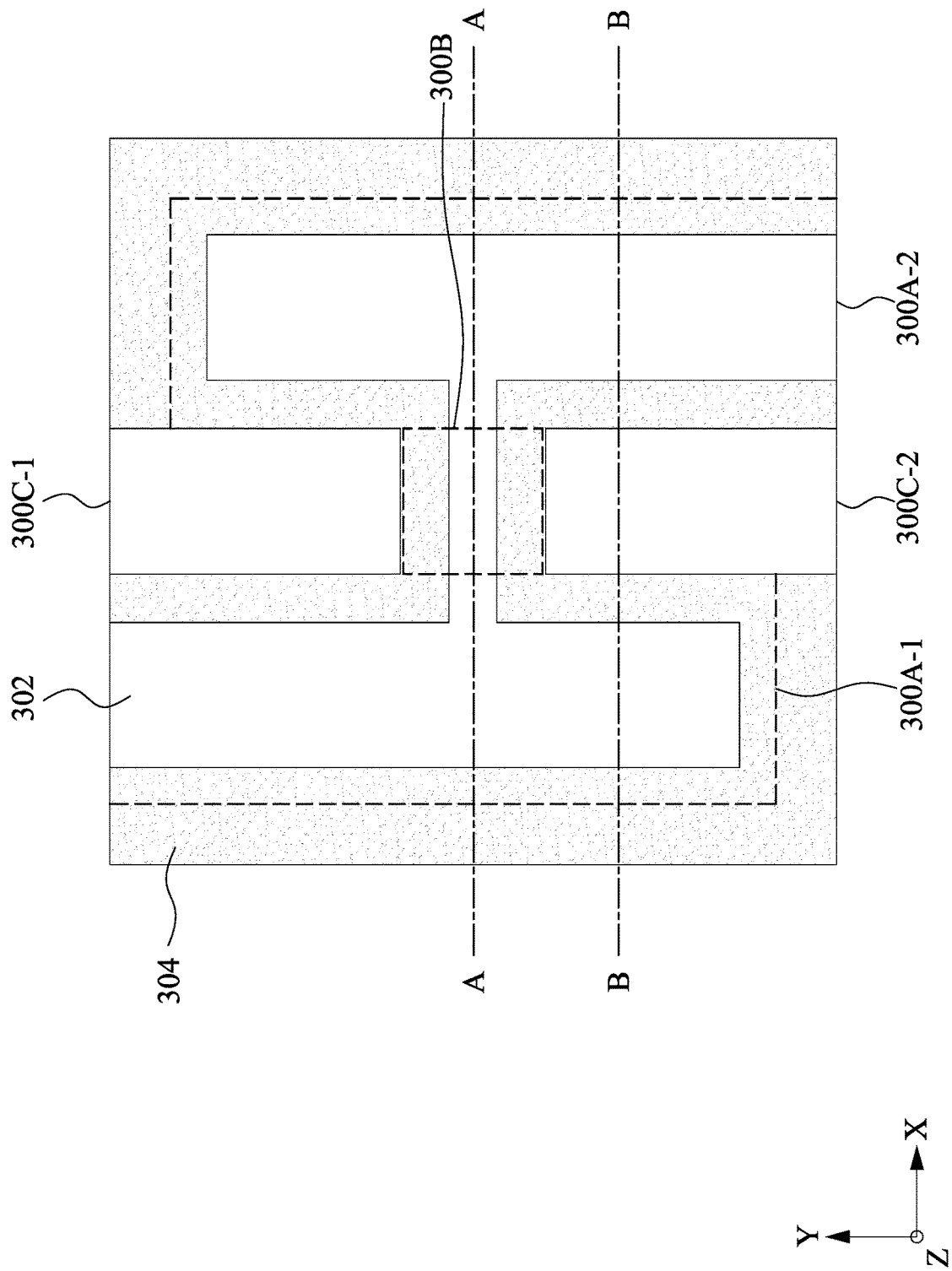
Figure 11B:
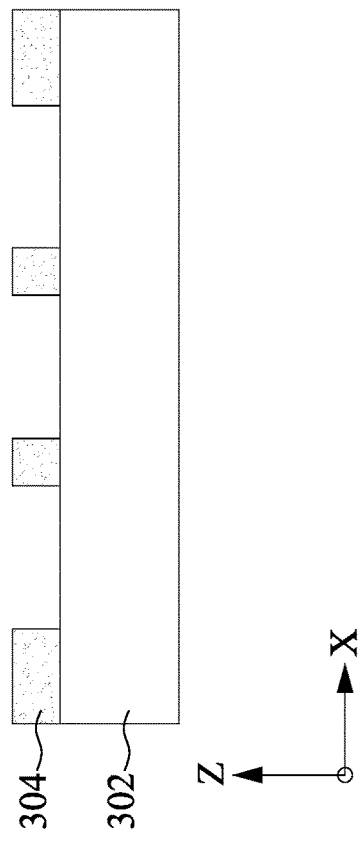
Figure 11A:
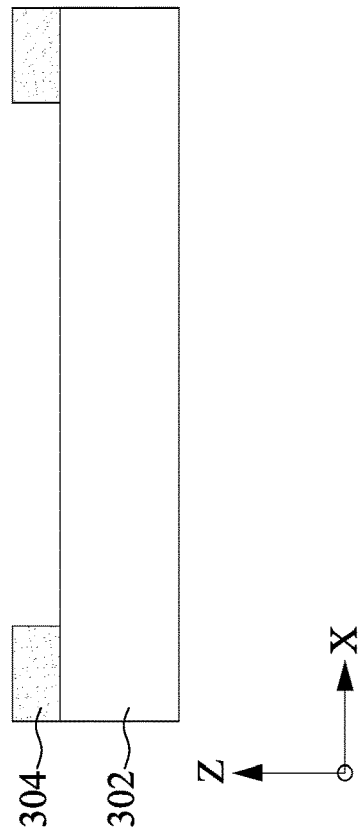

Referring to FIGS. 11, 11A, and 11B, an etching operation is performed to remove the layer 304 uncovered by the layer 308. In some embodiments, the layer 308 can serve as a mask to define the pattern of openings of the layer 304. After the etching operation is performed, the layer 308 can be removed.

Figure 12:
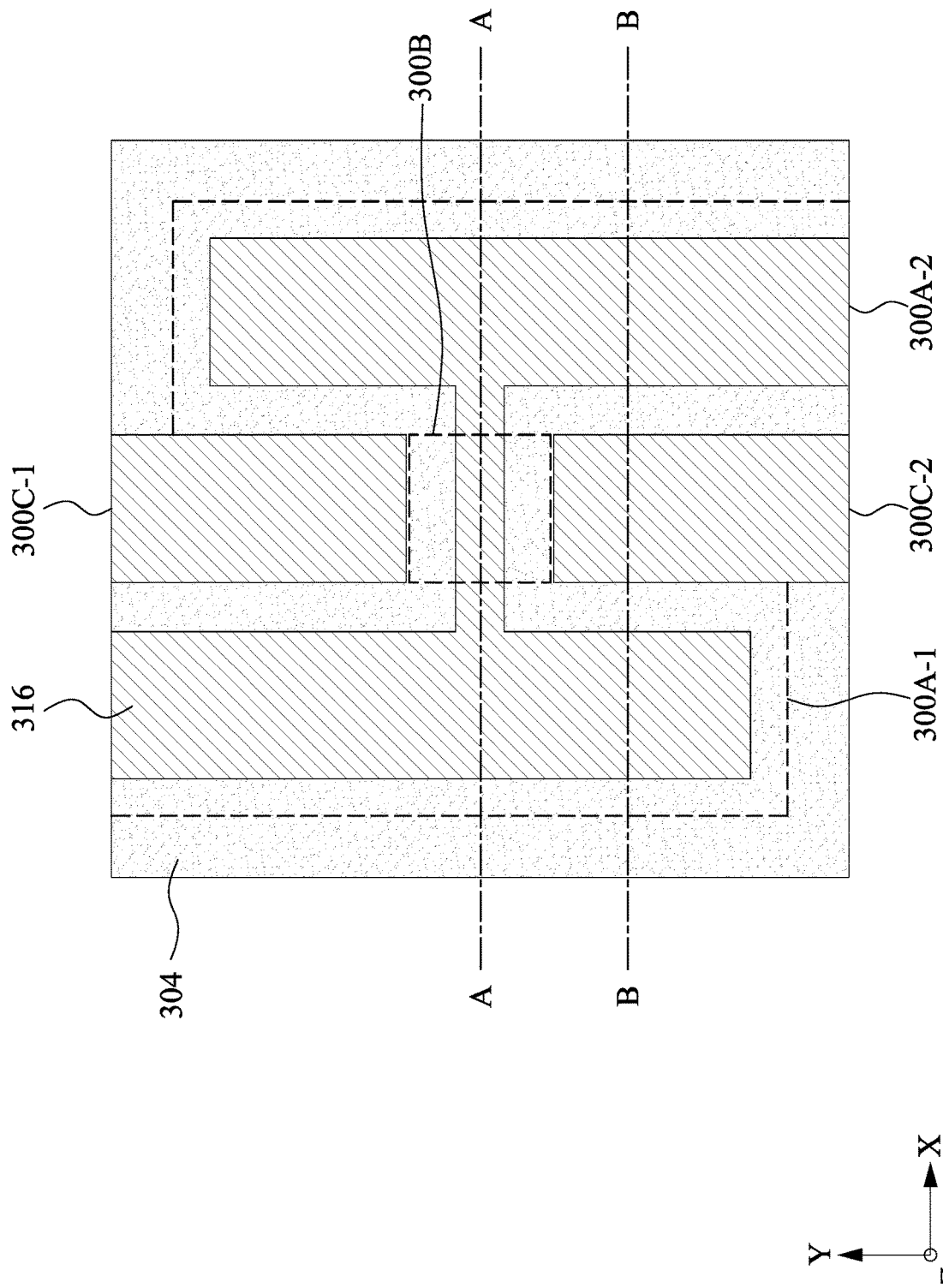
Figure 12B:
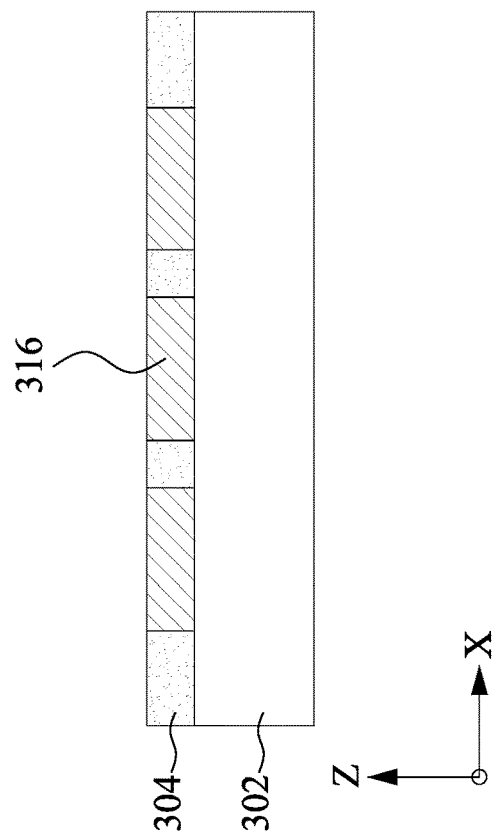
Figure 12A:
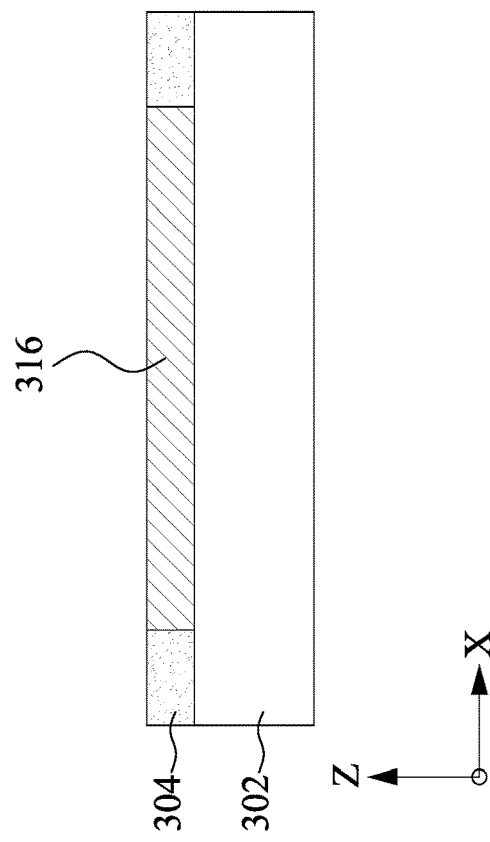

Referring to FIGS. 12, 12A, and 12B, a conductive material can be formed to fill the openings defined by the layer 304 to form the conductive pattern 316. As shown in FIG. 12, the conductive pattern 316 corresponding to the region 300A-1 can serve as a fuse element (e.g., fuse element 1051 shown in FIG. 2B). The conductive pattern 316 corresponding to the region 300A-2 can serve as a fuse element (e.g., fuse element 1052 shown in FIG. 2B). The conductive pattern 316 corresponding to the region 300B can serve as a fuse medium (e.g., fuse medium 1053 shown in FIG. 2B). The conductive pattern 316 corresponding to regions 300C-1 and 300C-2 can serve as dummy conductive layers (e.g., metallization layers 251 and 252 shown in FIG. 2B). In some embodiments, the conductive pattern 316 can be formed in an operation including forming M0 layer or M2 layer.

In this embodiment, the Cut B can be formed of sufficient width to ensure that a portion of the region 300B can be exposed by the profile modifier 312, resulting in the conductive pattern 316 being formed within the region 300B. Since the thickness of the profile modifier 312 can be controlled with less deviation, the width of the opening defined by the profile modifier 312 can be controlled more accurately. Thus, the width of the fuse medium can be controlled, thereby improving the performance of the semiconductor device.

Figure 13:
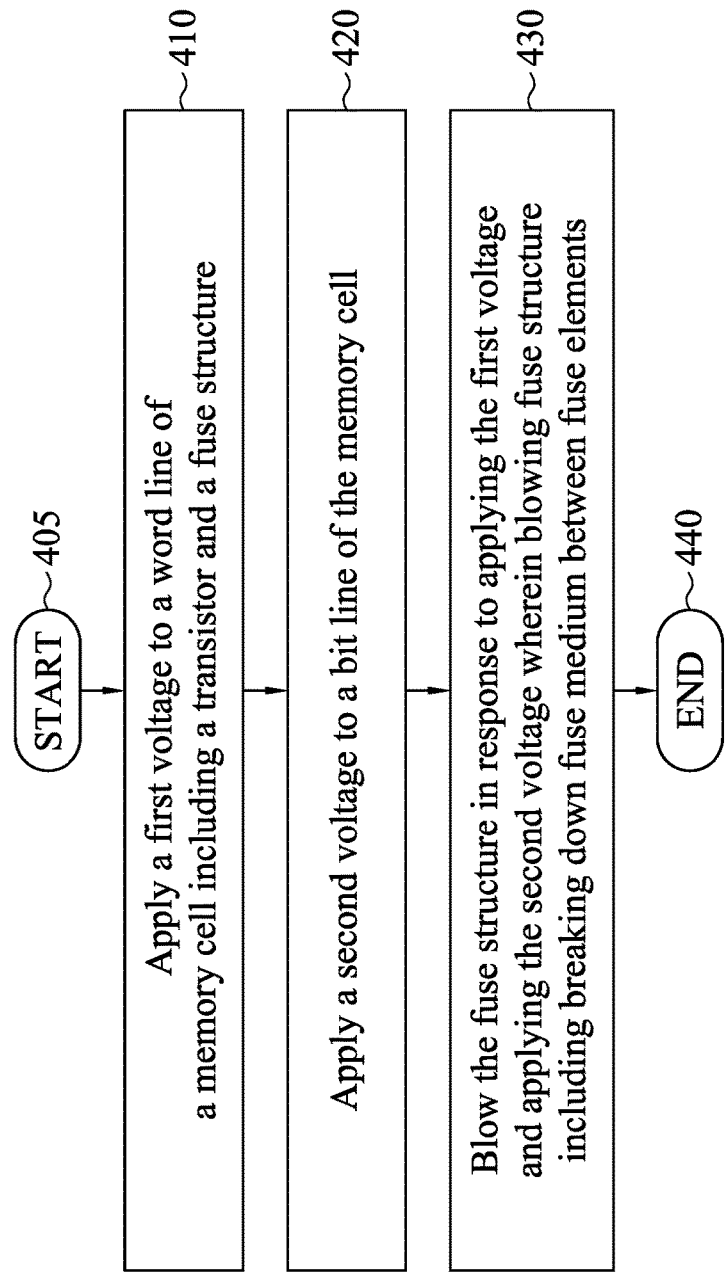
FIG. 13 is a flowchart of a method for programming a memory cell including a fuse structure, in accordance with some embodiments of the present disclosure.

FIG. 13 is a flowchart setting forth the general operations involved in a method 400 consistent with an embodiment of the disclosure for programming the memory cell 100 comprising a fuse structure. Implementation of method 400 is detailed as follows.

The illustrated method 400 begins at a starting block 605 and proceeds to an operation 410 in which a first voltage is applied to the word line 115 of the memory cell 100 including the transistor 110 and the fuse structure 105. For example, the first voltage may be the turn on voltage for transistor 110, which may comprise, for example, 1.8V.

From the operation 410, where the first voltage is applied to the word line 115 of the memory cell 100 comprising the transistor 110 and the fuse structure 105, the illustrated method 400 advances to an operation 420 in which a second voltage is applied to the bit line 120 of the memory cell 100. For example, the second voltage may comprise VDDQ which may be, for example, a value between 1.8V and 5V.

Once the second voltage is applied to the bit line 120 of the memory cell 100 in the operation 420, the method 400 may continue to an operation 430 in which the fuse structure 105 is blown in response to applying the first voltage and applying the second voltage. Consistent with embodiments of the disclosure, blowing the fuse structure 105 includes breaking down fuse medium 1053 between the fuse elements 1051 and 1052. For example, the fuse elements of the fuse structure 105 may be in the same metal layer, arranged in parallel with an overlap and offset. This arrangement of the fuse elements of the fuse structure 105 consistent with embodiments of the disclosure may also provide a lower programming current (i.e., to blow the dfuse) as compared to conventional fuses. Once the fuse structure 105 is blown in response to applying the first voltage and applying the second voltage in the operation 430, the method 400 may then end at operation 440.

The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method.

Figure 14:
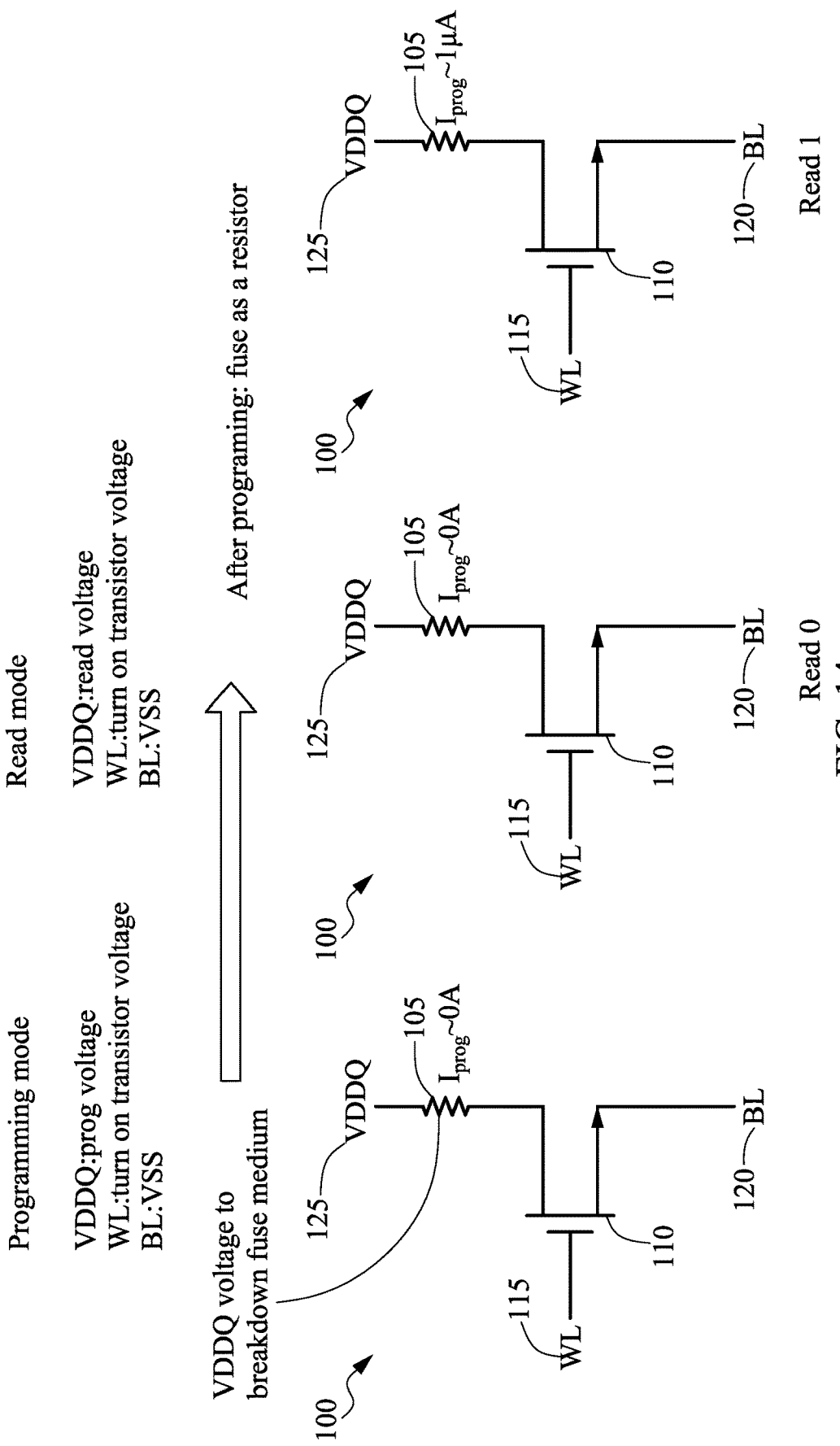
FIG. 14 illustrates programming and reading of a memory cell, in accordance with some embodiments of the present disclosure.

FIG. 14 illustrates programming and reading of a memory cell, in accordance with some embodiments of the present disclosure.

In a programming mode, the memory cell 100 may be programmed according to the process described with respect to FIG. 13. In a read mode, the word line 115 may be used to turn on the transistor 110. If the fuse structure 105 has not been blown, the memory cell 100 reads a "0" (i.e., Iread is approximately 0). If the fuse structure 105 has been blown, it may function as a resistor and the memory cell 100 reads a "1" (i.e., Iread is approximately, for example, 1 µA.

Some embodiments of the present disclosure provide a semiconductor device. The semiconductor device includes a transistor and a fuse structure electrically connected to the transistor. The fuse structure includes a first fuse element, a second fuse element, and a fuse medium. The second fuse element at least partially overlaps the first fuse element. The fuse medium connects the first fuse element and the second fuse element. The fuse medium includes an electrically conductive material.

Some embodiments of the present disclosure provide a semiconductor device. The semiconductor device includes a first fuse element, a second fuse element, a spacer, and a fuse medium. The second fuse element at least partially overlaps the first fuse element. The first fuse element has a first lateral surface facing a second lateral surface of the second fuse element. The spacer is disposed on the first lateral surface and the second lateral surface. The fuse medium extends from the first lateral surface to the second lateral surface.

Some embodiments of the present disclosure provide a method of operating a semiconductor device. The method includes applying a first voltage to a word line of a memory cell. The memory cell includes a transistor and a fuse structure. The fuse structure includes a first fuse element, a second fuse element at least partially overlapping the first fuse element, and a fuse medium connecting the first fuse element and the second fuse element. The fuse medium includes an electrically conductive material. The method also includes applying a second voltage to a bit line of the memory cell. The method further includes blowing the fuse structure in response to applying the first voltage and applying the second voltage wherein blowing the fuse structure includes breaking down the fuse medium between the first fuse element and the second fuse element.

The foregoing outlines structures of several embodiments so that those skilled in the art may better understand the aspects of the present disclosure. Those skilled in the art can appreciate that they may readily use the present disclosure as a basis for designing or modifying other processes and structures for carrying out the same purposes and/or achieving the same advantages of the embodiments introduced herein. Those skilled in the art can also recognize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a transistor; and
   a fuse structure electrically connected to the transistor, comprising:
      a first fuse element;
      a second fuse element at least partially overlapping the first fuse element; and
      a fuse medium connecting the first fuse element and the second fuse element, wherein the fuse medium comprises an electrically conductive material.

2. The semiconductor device of claim 1, wherein the first fuse element and the fuse medium include the same material.

3. The semiconductor device of claim 1, wherein the fuse medium is adapted to change from a first conductive state to a second conductive state after a current greater than a threshold level flows through the overlap region.

4. The semiconductor device of claim 3, wherein the fuse medium has a breakdown after a current greater than the threshold level flows through the fuse medium.

5. The semiconductor device of claim 1, wherein the first fuse element and the second fuse element are disposed in a metal zero layer or a metal two layer of an integrated circuit.

6. The semiconductor device of claim 1, wherein the first fuse element is substantially parallel to a gate electrode of an integrated circuit.

7. The semiconductor device of claim 1, wherein the first fuse element is substantially vertical to a gate electrode of an integrated circuit.

8. The semiconductor device of claim 1, further comprising:
a spacer disposed on a lateral surface of the fuse medium; and
a metallization layer disposed on the spacer, wherein the spacer is disposed between the metallization layer and the fuse medium.

9. The semiconductor device of claim 8, wherein the spacer is further disposed on a lateral surface of the first fuse element, and the spacer is disposed between the metallization layer and the first fuse element.

10. The semiconductor device of claim 8, wherein the metallization layer is electrically floating.

11. A semiconductor device, comprising:
a first fuse element;
a second fuse element at least partially overlapping the first fuse element, wherein the first fuse element has a first lateral surface facing a second lateral surface of the second fuse element;
a spacer disposed on the first lateral surface and the second lateral surface; and
a fuse medium extending from the first lateral surface to the second lateral surface.

12. The semiconductor device of claim 11, wherein the fuse medium has a first side extending between the first lateral surface and the second lateral surface, and the first side is covered by the spacer.

13. The semiconductor device of claim 12, further comprising:
a first metallization layer disposed on the first side of the fuse medium and spaced apart from the fuse medium by the spacer.

14. The semiconductor device of claim 13, further comprising:
a second metallization layer disposed on a second side, opposite to the first side, of the fuse medium, wherein the second metallization layer and the first metallization layer are spaced apart from each other at least by the fuse medium.

15. The semiconductor device of claim 14, wherein a distance between the first metallization layer and the second metallization layer is two times greater than a thickness of the spacer.

16. The semiconductor device of claim 13, wherein the first metallization layer is electrically isolated from the first fuse element.

17. The semiconductor device of claim 12, wherein the fuse medium comprises an electrically conductive material.

18. The semiconductor device of claim 11, wherein the first fuse element is connected to a transistor comprising a metal-oxide-semiconductor field-effect transistor.

19. The semiconductor device of claim 11, wherein the second fuse element is connected to a VDDQ.

20. A method of operating a semiconductor device, comprising:
applying a first voltage to a word line of a non-volatile memory cell comprising a transistor and a fuse structure, the fuse structure comprising:
a first fuse element;
a second fuse element at least partially overlapping the first fuse element; and
a fuse medium connecting the first fuse element and the second fuse element, wherein the fuse medium comprises an electrically conductive material;
applying a second voltage to a bit line of the memory cell; and
blowing the fuse structure in response to applying the first voltage and applying the second voltage, wherein blowing the fuse structure comprises breaking down the fuse medium between the first fuse element and the second fuse element.

* * * * *